United States Patent
Tanabe

[11] Patent Number: 5,945,237
[45] Date of Patent: Aug. 31, 1999

[54] HALFTONE PHASE-SHIFT MASK AND HALFTONE PHASE-SHIFT MASK DEFECT CORRECTION METHOD

[75] Inventor: Hiroyoshi Tanabe, Tokyo, Japan

[73] Assignee: NEC Corporation, Tokyo, Japan

[21] Appl. No.: 08/998,834

[22] Filed: Dec. 29, 1997

[30] Foreign Application Priority Data

Dec. 27, 1996 [JP] Japan .................................. 8-349489

[51] Int. Cl.$^6$ ........................................ G03F 9/00
[52] U.S. Cl. ............................................... 430/5
[58] Field of Search ........................ 430/5, 322, 311, 430/394

[56] References Cited

U.S. PATENT DOCUMENTS 5,593,801  1/1997  Yoshioka et al. ............................ 430/5

FOREIGN PATENT DOCUMENTS

| | | |
|---|---|---|
| 6-136854 | 5/1992 | Japan . |
| 6-282063 | 10/1994 | Japan . |
| 7-146544 | 6/1995 | Japan . |
| 7-219211 | 8/1995 | Japan . |
| 7-295204 | 11/1995 | Japan . |

*Primary Examiner*—S. Rosasco
*Attorney, Agent, or Firm*—Sughrue, Mion, Zinn Macpeak & Seas, PLLC

[57] ABSTRACT

In a halftone phase-shift mask, a phase-inverting light transmission part is formed inside the light-blocking part which blocks light that is radiated onto a transparent substrate so as to cover a shifter missing part defect, this phase-inverting light transmission part inverting the phase of light that passes through it with respect to light that passes through a light transmission part. The ratio between the surface areas of the phase-inverting light transmission part and the light-blocking part is established so that the transfer characteristics of the light-blocking part during exposure are substantially the same as those of the translucent phase-shift part.

23 Claims, 27 Drawing Sheets

Fig. 2
(a)
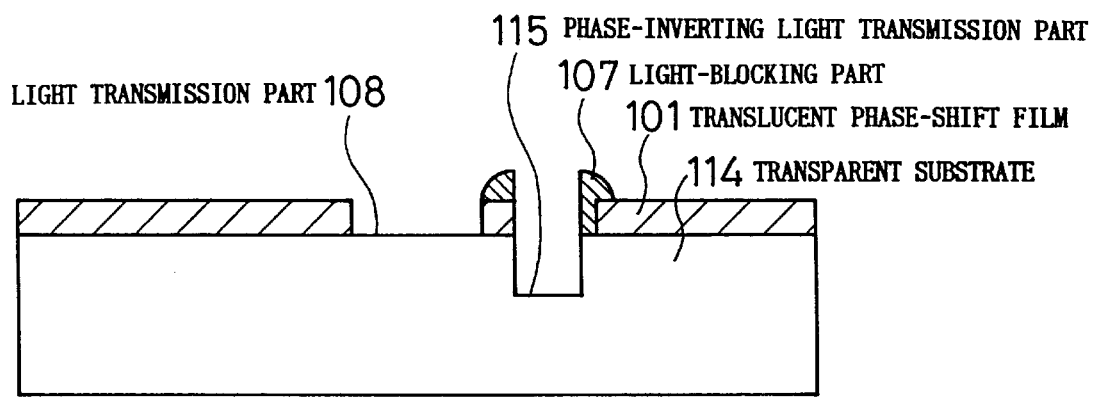
- 115 PHASE-INVERTING LIGHT TRANSMISSION PART
- 107 LIGHT-BLOCKING PART
- 101 TRANSLUCENT PHASE-SHIFT FILM
- 114 TRANSPARENT SUBSTRATE
- LIGHT TRANSMISSION PART 108
(b)
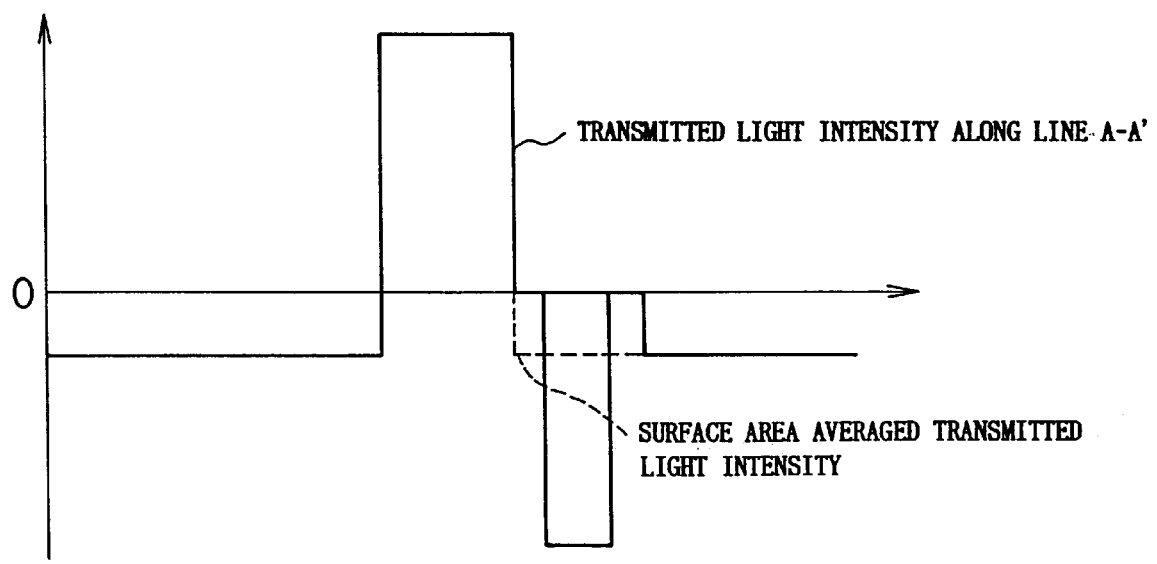
TRANSMITTED LIGHT INTENSITY ALONG LINE A-A'
SURFACE AREA AVERAGED TRANSMITTED LIGHT INTENSITY Fig. 10
(a)
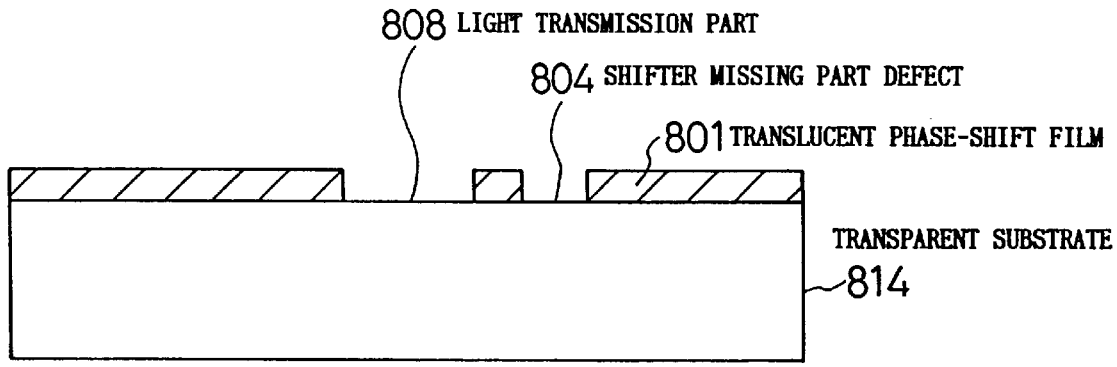
(b)
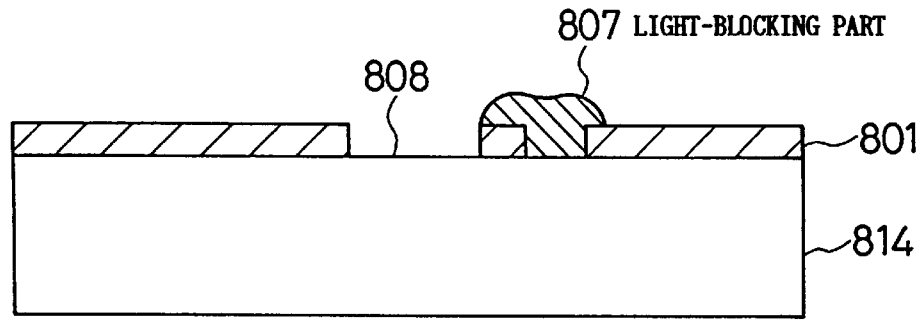
(c)
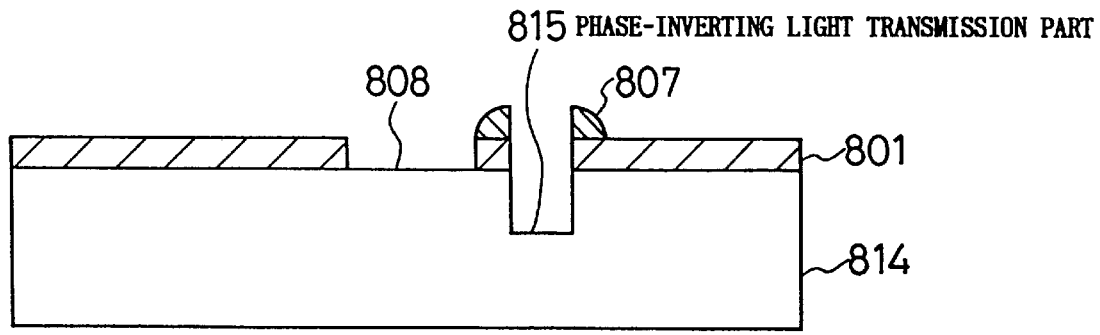

Fig. 11
(a)
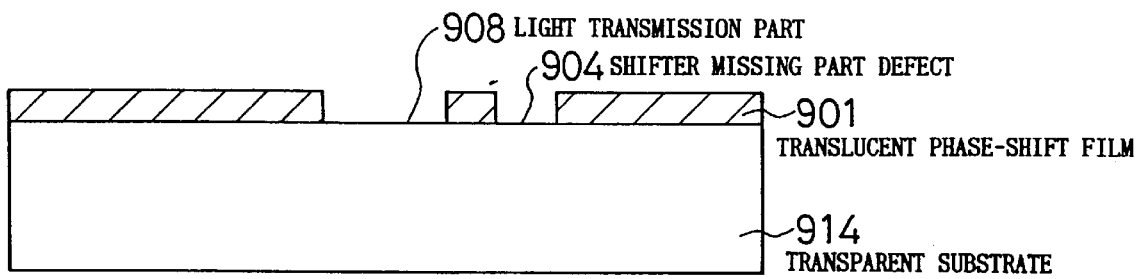
- 908 LIGHT TRANSMISSION PART
- 904 SHIFTER MISSING PART DEFECT
- 901 TRANSLUCENT PHASE-SHIFT FILM
- 914 TRANSPARENT SUBSTRATE
(b)
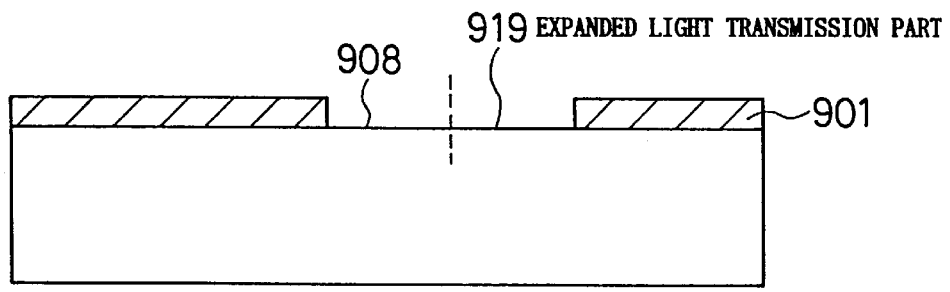
- 919 EXPANDED LIGHT TRANSMISSION PART
(c)
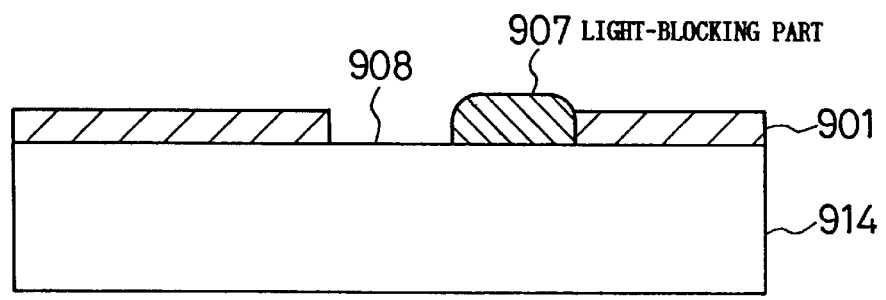
- 907 LIGHT-BLOCKING PART
(d)
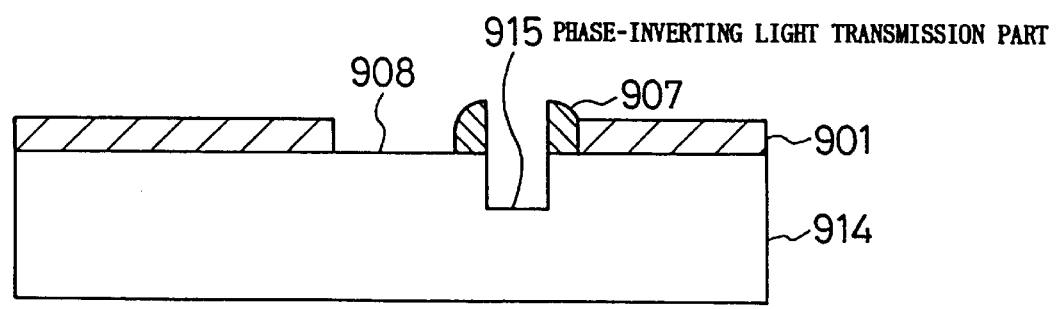
- 915 PHASE-INVERTING LIGHT TRANSMISSION PART

Fig. 12
(a)
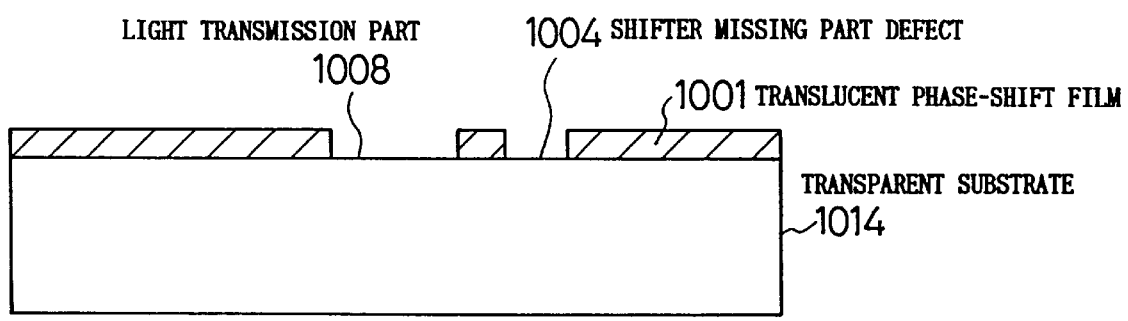
(b)
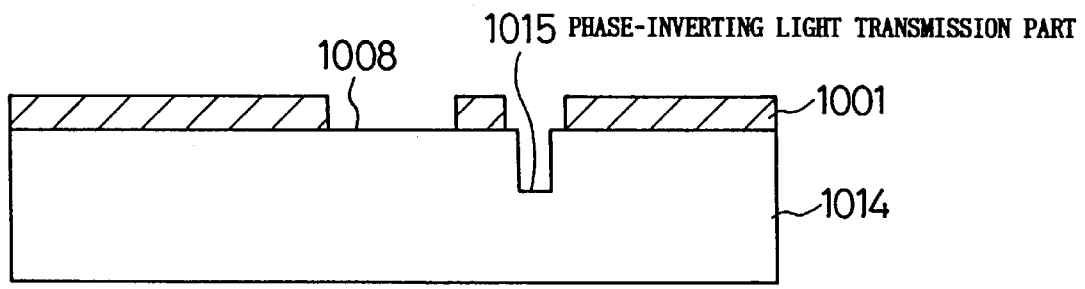

Fig.13
(a)
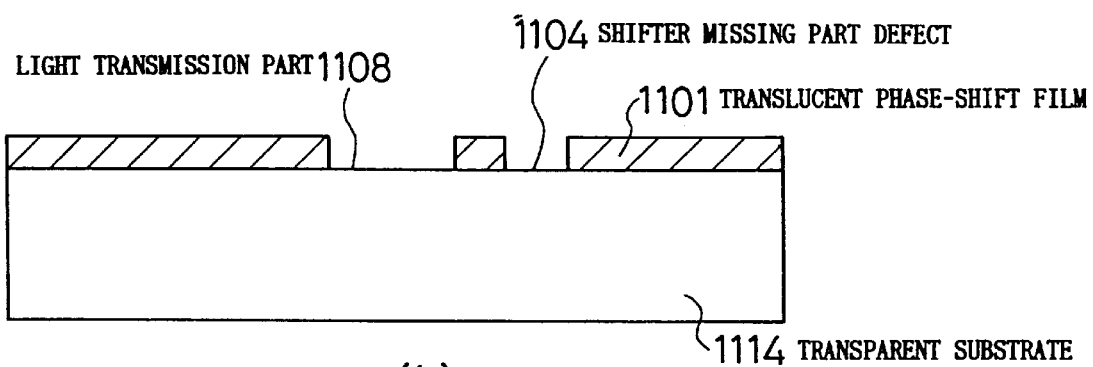
(b)
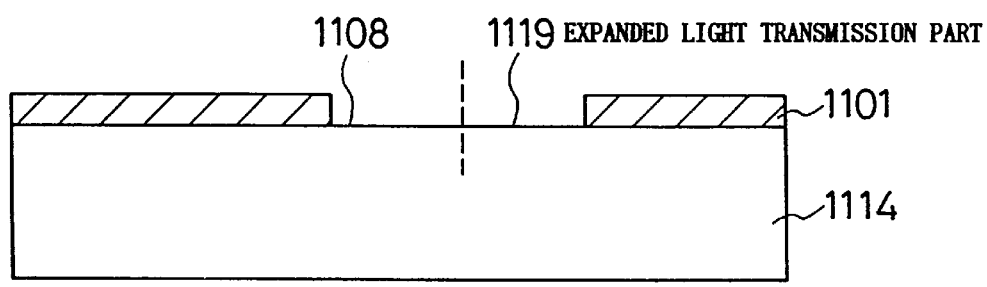
(c)
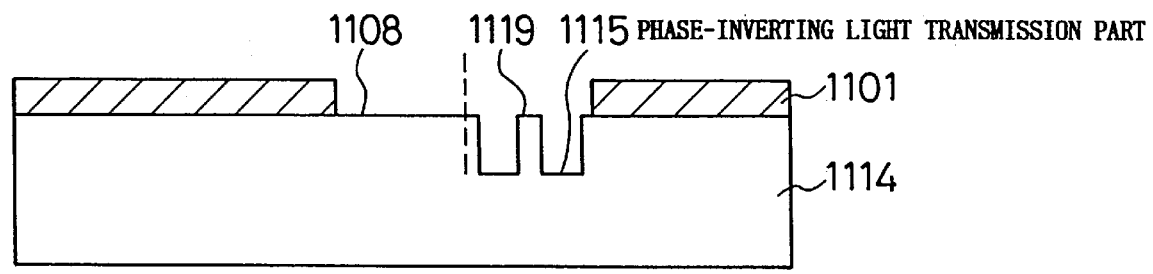

Fig.14
(a)
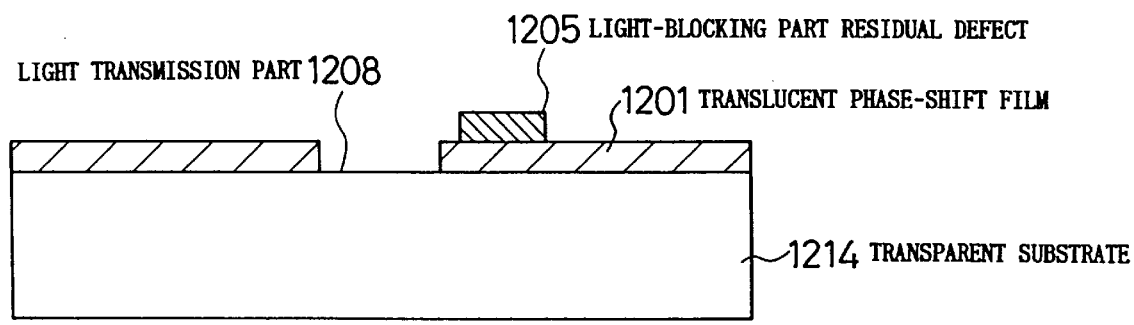
(b)
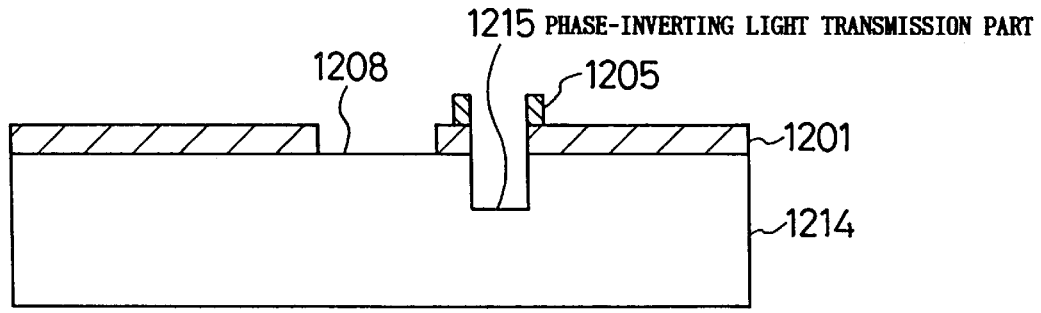

Fig. 16
(a)
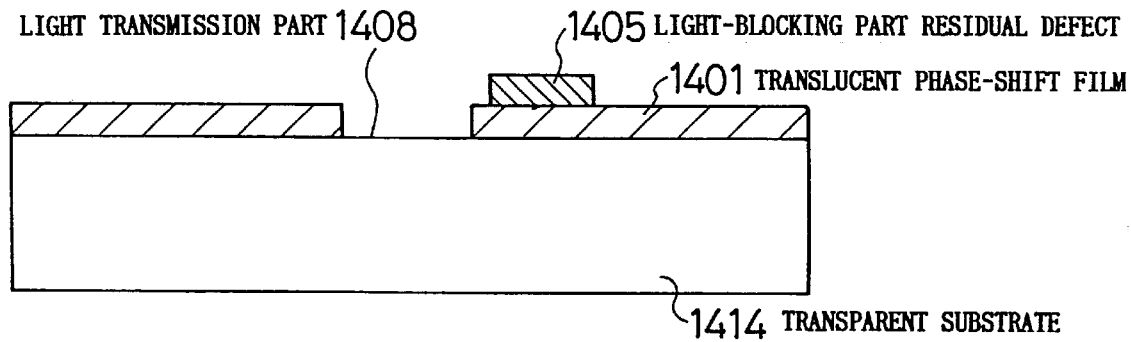
(b)
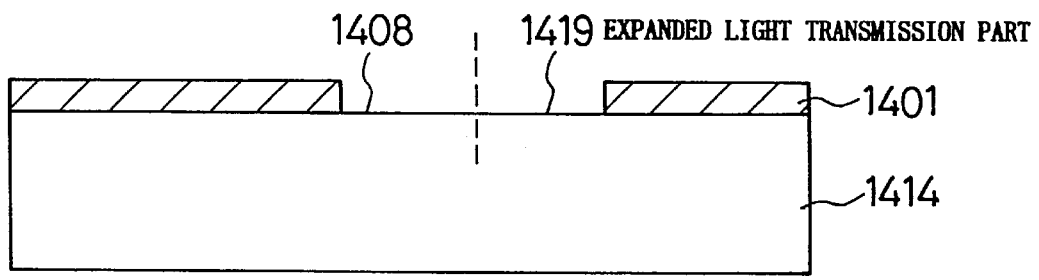
(c)
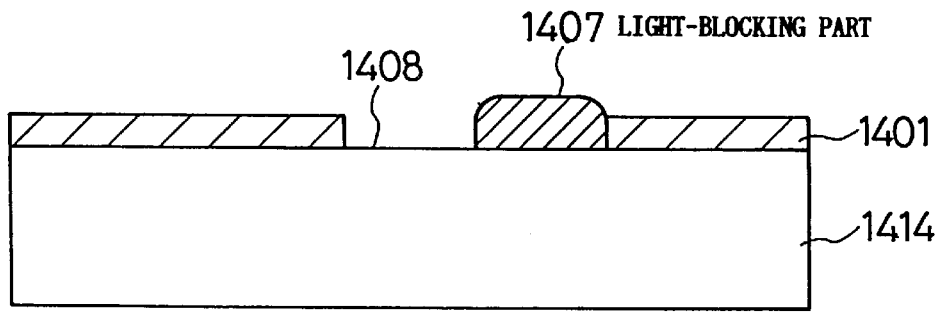
(d)
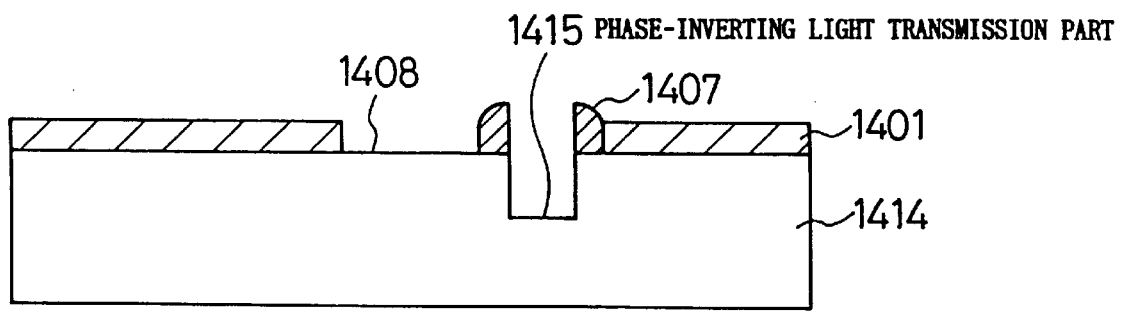

Fig.17
(a)
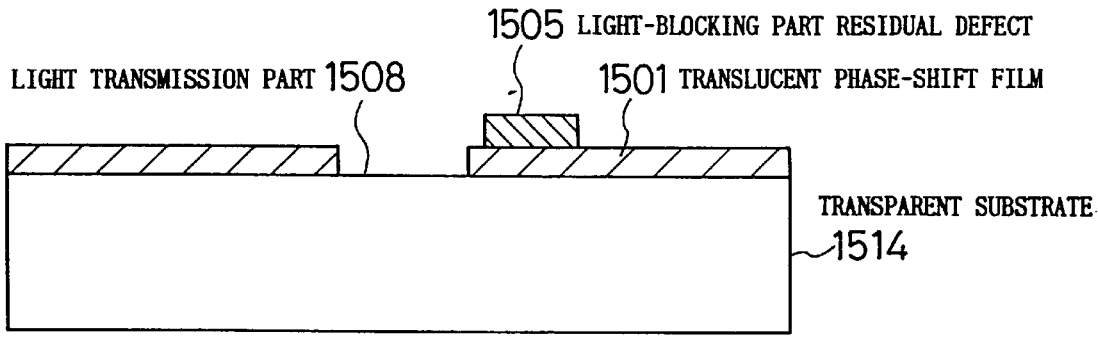
(b)
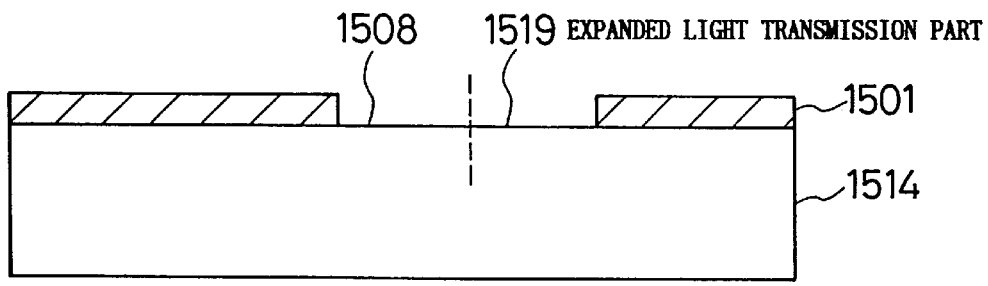
(c)
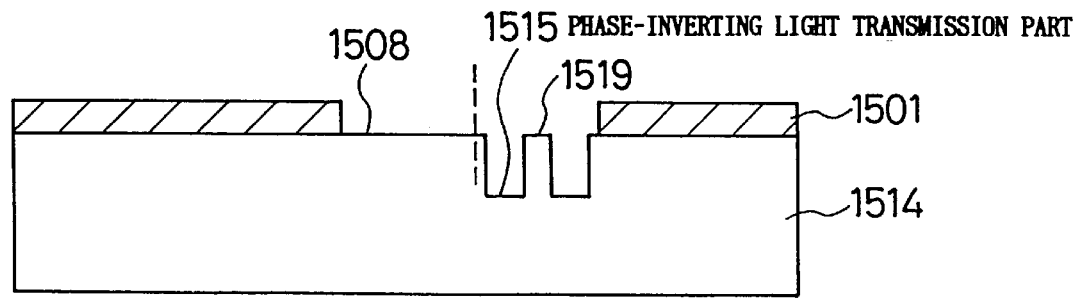

Fig.18
(a)
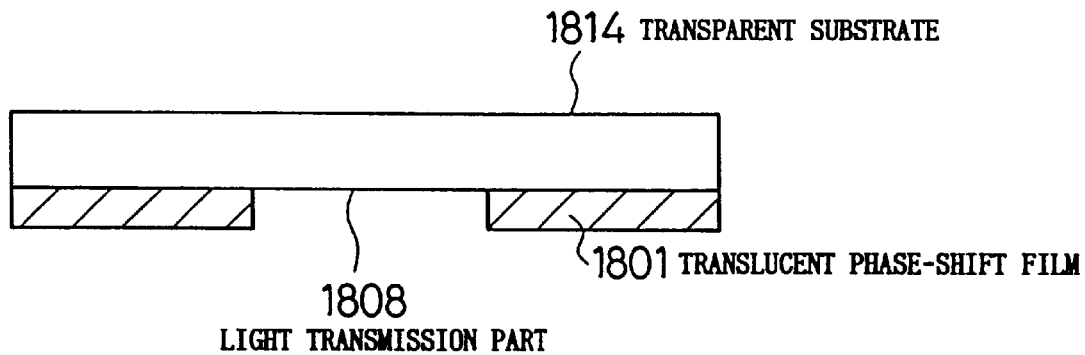
(b)
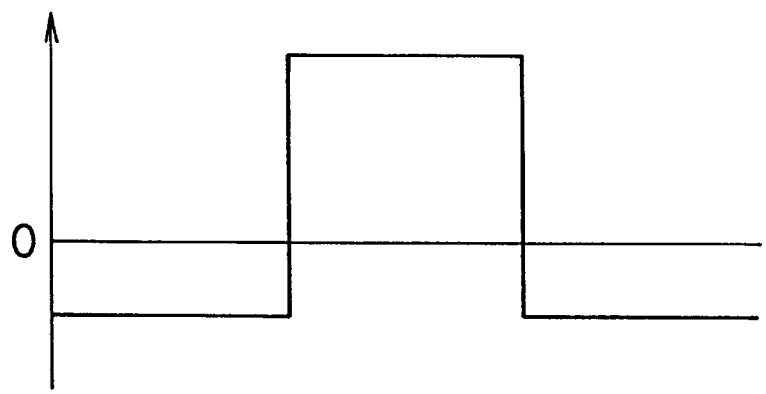
(c)
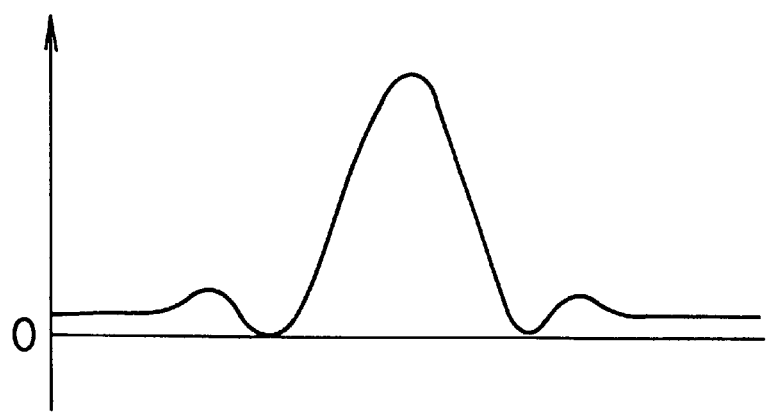

HALFTONE PHASE-SHIFT MASK AND HALFTONE PHASE-SHIFT MASK DEFECT CORRECTION METHOD

BACKGROUND OF THE INVENTION

1. Field of the Invention

The present invention relates to a halftone phase-shift mask which is used in a lithographic process in manufacturing a semiconductor device and also to a method of correcting a defect therein.

2. Description of Related Art

With an increase in the level of integration of semiconductor integrated circuits, there have been rapid advances in the minimizing of micropatterns used for circuitry. In lithographic technology used in a projection-type exposure apparatus, there is a limit to resolution that is caused by the wavelength of the light source used.

In recent years, to improve the resolution, there has been active development of phase-shift masks on which a pattern is formed on a photomask using a phase-shift material.

There has been a variety of types of phase-shift masks proposed to date, of which a halftone phase-shift mask that is disclosed in Japanese Unexamined Patent Publication No. 4-136854, which, because of its simple construction is starting to be used in production of semiconductor integrated circuits.

A description of the halftone phase-shift mask which is disclosed in Japanese Unexamined Patent Publication No. 4-136854 follows.

FIG. 18 is a drawing which illustrates the configuration of a halftone phase-shift mask that is disclosed in Japanese Unexamined Patent Publication No. 4-136854, FIG. 18 (*a*) being a cross-sectional view of the halftone phase-shift mask, FIG. 18 (*b*) showing the amplitude of light which passes through the halftone phase-shift mask which is shown in FIG. 18 (*a*), and FIG. 18 (*c*) being a drawing which shows the light intensity distribution on a wafer.

In the prior art, as shown in FIG. 18 (*a*), patterning is done of a translucent phase-shift film 1801 on top of a transparent substrate 1814 in a prescribed configuration.

In the case of radiating light onto a substrate such as shown in FIG. 18 (*a*), as shown in FIG. 18 (*b*), the light which passes through the translucent phase-shift film 1801, compared with the light that passes through the transmitted light pars 1808 at which the transparent substrate 1814 is exposed, has an attenuated amplitude and an inverted phase.

If this light is passed through a lens and projected upon the wafer, as shown in FIG. 18 (*c*), because of the phase inversion at the boundary between the transmitted light part 1808 and the translucent phase-shift film 1801, the light intensity at this boundary part is almost zero. For this reason, broadening of the light intensity distribution is suppressed, making it possible to transfer to a photoresist film a pattern having a high resolution.

The light which is transmitted through the translucent phase-shift film 1801 is not transferred to the photoresist film on the wafer with a single exposure only.

In the usual exposure process, however, the same pattern of one and the same photomask is transferred repeatedly at different positions on one and the same wafer. When doing this, rather than the entire photomask being transferred, only a part of the photomask is transferred by means of an aperture in the optics system of the projection-type exposure apparatus.

However, because it is difficult to perform precise exposure of only the transfer region at the aperture, when using a halftone phase-shift mask to perform repeated exposures, there are cases in which the transmitted light of the translucent part overlaps the boundary region, this being added to the amount of exposure light that is transferred.

To solve the above-noted problem, a halftone phase-shift mask in which the transfer region is surrounded by a light-blocking part was disclosed in the Japanese Unexamined Patent Publication No. 6-282063.

FIG. 19 is a top plan view which shows the configuration of a halftone phase-shift mask that is disclosed in the Japanese Unexamined Patent Publication No.6-282063.

In the prior art, as shown in FIG. 19, on the outside of the transfer region, an outer peripheral light block part 1902 that surrounds the transfer region is provided. This outer peripheral light block part may be a chromium film, for example, on an upper layer of the translucent phase-shift film 1901. By using this type of halftone phase-shift mask, it is possible to prevent unwanted transfer onto the transfer region.

A method for correcting a defect when it occurs in a halftone phase-shift mask is described below.

As shown in FIG. 19, there are four types of defects in the halftone phase-shift mask, a shifter residual part defect 1903, a shifter missing part defect 1904, a light block part residual part defect 1905, and a light-blocking part missing part defect 1906.

With respect to the shifter residual part defect 1903, a laser blowing method using a YAG laser that is used with photomasks in the past, or the method of using a focused ion beam (FIB) to perform gas-assisted etching can be used to correct the defect.

With respect to the light-blocking part missing part defect 1906, FIB assist gas deposition that uses either a hydrocarbon-based gas or metallic carbonyl gas that was generally used in the past can be used to bury a carbon type light-blocking film or metallic film to effect the correction of the defect.

With respect to the shifter missing part defect 1904, similar to the case of a light-blocking part missing part defect 1906, it is generally possible to use FIB assist gas deposition to bury a carbon type light-blocking film to correct the defect.

FIG. 20 is a plan view of a halftone phase-shift mask after correction of a shifter missing part defect 1904 as shown in FIG. 19.

As shown in FIG. 20, the shifter missing part defect 1904 is covered by a light-blocking part 1907, so that the shifter missing part defect 1904 is corrected.

Finally, with respect to a light-blocking part residual part defect 1905, there is currently no effect method of correction available. Because a light-blocking part residual part defect 1905 exists in the upper layer of the translucent phase-shift film 1901, methods which use laser blowing or FIB to remove the defect would also remove the translucent phase-shift film 1901.

As shown in FIG. 20, in the case in which a shifter missing part defect 1904 occurs near the light transmission part 1908, if the shifter missing part defect 1904 is corrected by covering the shifter missing part defect 1904 with the light-blocking part 1907, the light-blocking part 1907 after the correction exists near the light transmission part 1908, in which case, because there are different light transmission characteristics with respect to exposure light in the translucent phase-shift film 1901 and the light-blocking part 1907, a change occurs in the transferred photoresist pattern.

FIG. 21 is a top plan view which shows an example of a halftone phase-shift mask of the past that does not have a shifter missing part defect, and FIG. 22 is a drawing which shows a photoresist film transfer pattern for the case of using the halftone phase-shift mask that is shown in FIG. 21.

As shown in FIG. 21, in the case of performing exposure using a halftone phase-shift mask having a normal light transmission part 2108 and a translucent phase-shift film 2101 without a shifter missing part defect, the positive photoresist film after developing is as shown in FIG. 22, with a clean circular pattern 2210 formed in the photoresist film 2209.

FIG. 23 is a drawing which shows the photoresist film transfer pattern for the case of using the halftone phase-shift mask that is shown in FIG. 20.

As shown in FIG. 23, in the case of using a halftone phase-shift mask in which a shifter missing part defect 1904 was corrected as shown in FIG. 20, the positive phase-shift film 2309 after developing is the asymmetrical pattern 2312.

FIG. 24 is a graph which shows the light intensity distribution on the photoresist film for the case in which the halftone phase-shift masks shown in FIG. 20 and FIG. 21 are used. The solid line is the exposure light intensity on the photoresist film along the cross section C-C' shown in FIG. 20, and the dashed line is the exposure light intensity on the photoresist film along the cross section D-D' shown in FIG. 21.

In obtaining the above, a KrF excimer laser having a wavelength $\lambda=248$ nm was used as the exposure light source, the numerical aperture (NA) of the projection lens system of the stepper used was 0.5, the coherence, $\sigma$, of the illumination optics system was 0.4, the projection magnification factor was ⅕, the size of the first light transmission section 8 was 1.25 $\mu$m, and the light transmissivity T of the translucent phase-shift film 1 was 6%.

As shown in FIG. 24, in the case of using a normal halftone phase-shift mask without a defect, the light intensity distribution on the photoresist is symmetrical about the center, as shown by the dashed line.

However, when using a halftone phase-shift mask in which a defect has been corrected, the light intensity distribution on the photoresist is not symmetrical, as shown by the solid line.

This is because, in the halftone phase-shift mask in which a defect has been corrected, there is a light-blocking film 1907 that is formed in the region of the boundary between the light transmission part 1908 and the translucent phase shift film 1901, so that this part does not operate as a halftone phase-shift mask.

In the case in which a halftone phase-shift mask having such a corrected defect is used, for example, in forming a contact hole of a semiconductor circuit, variations occur in the electrical characteristics, this at times leading to failure caused by a short.

To solve the above-noted problem, a method of correcting a shifter missing part defect which uses a lift-off method was proposed in the Japanese Unexamined Patent Publication No. 7-146544.

FIG. 25 is a cross-sectional view which shows the configuration of a halftone phase-shift mask in which the defect correction method that is disclosed in the Japanese Unexamined Patent Publication No. 7-146544 has been applied.

In the disclosure made in the Japanese Unexamined Patent Publication No. 7-146544, as shown in FIG. 25, the lift-off method is used to bury in the shifter missing part defect 2504 a correction material 2517 of the same type as a translucent phase-shift film 2501.

However, to use the lift-off method, it is necessary to pattern the resist that is exposed only at the correction part, and there is a danger causing a new defect when performing patterning of the resist. Additionally, when using the lift-off method, there is the problem of a complex process of resist application, exposure, development, patterning, and resist peeling and the like being required, so that the correction time is long.

Additionally, to make the optical characteristics of the correction material by the lift-off method the same as those of the translucent phase-shift film 2501, it is necessary to perform exacting control of the sputtering conditions.

Another method of correcting a shifter missing part defect is disclosed in the Japanese Unexamined Patent Publication No. 7-219211.

FIG. 26 is a cross-sectional view which shows the configuration of a halftone phase-shift mask to which the defect correction method disclosed in the Japanese Unexamined Patent Publication No. 7-219211 has been applied.

In the method disclosed in the Japanese Unexamined Patent Publication No. 7-219211, as shown in FIG. 26, of the transparent substrate 2614, the bottom part of the shifter missing part defect 2604 is etched by using the FIB method, this causing a 180-degree shift in the phase, and beneath the etched region an ion-implanted layer 2618 is formed, thereby adjusting the transmissivity, so that this functions the same way as the halftone phase-shift mask.

However, because both the index of refraction and the absorption coefficient of the region in which ion implantation is done change, to impart the same optical characteristics to the ion-implanted region 1608 as the translucent phase-shift film 2601, it is necessary to control the etching depth and the amount of ion implantation.

Another method of correcting a shifter missing part defect is disclosed in the Japanese Unexamined Patent Publication No. 7-295204.

FIG. 27 is a top plan view of a halftone phase-shift mask to which the defect correction method which is disclosed in the Japanese Unexamined Patent Publication No. 7-295204 has been applied.

In the method which is disclosed in the Japanese Unexamined Patent Publication No. 7-295204, a shifter missing part defect 2704 is magnified by laser blowing, and the lift-off method which is the same as disclosed in the Japanese Unexamined Patent Publication No. 7-146544 is used to bury a correction material inside the magnified aperture part, after which laser blowing is used to form the actual aperture, thereby forming the corrected translucent phase-shift film 2721.

However, in the above method there is the same problem as occurs in the method which is disclosed in the Japanese Unexamined Patent Publication No. 7-146544, and there is an additional process that is required.

In a light-blocking part missing part defect, as shown in FIG. 19, if the defect occurs near the light transmission part 1908, similar to the shifter missing part defect after correction by means of the light transmission film shown in FIG. 20, there is a deterioration of the resist pattern transfer characteristics. With regard to this problem, it is not possible to use the past method of correcting a shifter missing part defect as is.

The present invention was made in consideration of the above-described drawbacks of the prior art and has as an object the provision of a method of correcting a shifter missing part defect and light-blocking residual defect of a halftone phase-shift mask without sacrificing the resist pattern transfer characteristics of the halftone phase-shift mask, and a halftone phase-shift mask to which this method is applied.

SUMMARY OF THE INVENTION

To achieve the above-noted object, the present invention is a halftone phase-shift mask having a light transmission part which passes as is light which is shone onto a substrate onto which is mounted a semiconductor integrated circuit;

a translucent phase-shift part that not only inverts the phase of said light but also attenuates the amplitude of said light, said translucent phase-shift part having a shifter missing part defect at which there is partial loss of said shifter;

a light-blocking part provided so as to cover said shifter missing part defect and which does not allow said light to pass therethrough;

wherein, a phase-inverting light transmission part provided in said light-blocking part, and that inverts the phase of said light which passes through the inside said light-blocking part, with respect to the phase of said light which passes through said light transmission part, and further wherein the surface areas of said phase-inverting light transmission part and said light-blocking part have a mutual ratio value that is established so that the transfer characteristics of said light-blocking part during exposure are substantially the same as those in said translucent phase-shift part. If the surface area of said light-blocking part is S, the surface area of said phase-inverting light transmission part is s, the amplitude transmissivity of said translucent phase-shift film is t, and the amplitude transmissivity of said phase-inverting light transmission part is t', the value of the surface areas of said phase-inverting light transmission part and said light-blocking part is each established so that the relationship $s/S=t/t'$ is satisfied.

Additionally, to achieve the above-noted object the present invention is a halftone phase-shift mask having a light transmission part which passes as is light which is shone onto a substrate onto which is mounted a semiconductor integrated circuit;

a translucent phase-shift part that not only inverts the phase of said light but also attenuates the amplitude of said light, said translucent phase-shift part having a shifter missing part defect at which there is partial loss of said shifter;

wherein, a phase-inverting light transmission part provided in said shifter missing part defect and that inverts the phase of light which passes through the inside with respect to the phase of said light which passes through said light transmission part; and further wherein the surface area of said phase-inverting light transmission part is set at a value so that a value of a surface area ratio between said phase-inverting light transmission part and said shifter missing part defect is substantially equal to a value of a ratio taken between the transfer characteristics of said shifter missing part defect during exposure and that of said translucent phase-shift part.

If the surface area of said shifter missing part defect is S2, the surface area of said phase-inverting light transmission part is s, the amplitude transmissivity of said translucent phase-shift film is t, and the amplitude transmissivity of said phase-inverting light transmission part is t', the value of the surface area of said phase-inverting light transmission part is established so that the relationship $s/S2=(1-t)/(1-t')$ is satisfied.

Additionally, to achieve the above-noted object, the present invention is a halftone phase-shift mask having a light transmission part which passes as is light which is shone onto a substrate onto which is mounted a semiconductor integrated circuit;

a translucent phase-shift part that not only inverts the phase of said light but also attenuates the amplitude of said light, this translucent phase-shift part having a shifter missing part defect at which there is partial loss of said shifter;

wherein, an expanded light transmission part that is formed so as to cover said shifter missing part defect and which has a phase-inverting light transmission part that inverts the phase of said light which passes through the inside said shifter missing part defect with respect to the phase of said light which passes through said light transmission part, further wherein, the surface area ratio of said expanded light transmission part and said phase-inverting light transmission part is established so that the transfer characteristics of said expanded light transmission part during exposure are substantially the same as those in said translucent phase-shift part. If the surface area of said expanded light transmission part is S3, the surface area of said phase-inverting light transmission part is s, the amplitude transmissivity of said translucent phase-shift film is t, and the amplitude transmissivity of said phase-inverting light transmission part is t', the value of the surface areas of said expanded light transmission part and said phase-inverting light transmission part is established so that the relationship $s/S3=(1-t)/(1-t')$ is satisfied.

Additionally, to achieve the above-noted object, the present invention is a halftone phase-shift mask having a light transmission part which passes as is light which is shone onto a substrate onto which :is mounted a semiconductor integrated circuit;

a light-blocking part which does not pass said light therethrough;

a translucent phase-shift part that not only inverts the phase of said light but also attenuates the amplitude of said light, this translucent phase-shift part having a light-blocking residual defect at which said light-blocking part remains;

wherein, a phase-inverting light transmission part being provided in said light-blocking residual defect and that inverts the phase of the light which passes through the inside thereof with respect to the phase of said light which passes through said light transmission part; and further wherein the surface area of said phase-inverting light transmission part is set at a value so that a value of a surface area ratio between said phase-inverting light transmission part and said light-blocking part residual defect is substantially equal to a value of a ratio taken between the transfer characteristics of said light-blocking residual defect during exposure and that of said translucent phase-shift part.

If the surface area of said light-blocking part residual defect expanded light transmission part is S4, the surface area of said phase-inverting light transmission part is s, the amplitude transmissivity of said translucent phase-shift film is t, and the amplitude transmissivity of said phase-inverting light transmission part is t', the value of the surface area of said phase-inverting light transmission part is established so that the relationship $s/S4=t/t'$ is satisfied.

Additionally, to achieve the above-noted object, the present invention is a halftone phase-shift mask having a light transmission part which passes as is light which is shone onto a substrate onto which is mounted a semiconductor integrated circuit;

a light-blocking part which does not pass said light;

a translucent phase-shift part that not only inverts the phase of said light but also attenuates the amplitude of said light, said translucent phase-shift part having a light-blocking part residual defect at which said light-blocking part remains; and an expanded light-blocking part that is formed so as to cover said light-blocking part residual defect and which has a phase-inverting light transmission part that inverts the phase of light which passes through the inside said light-blocking part residual defect, with respect to the phase of said light which passes through said light transmission part, wherein the surface area ratio of said expanded light-blocking part and said phase-inverting light transmission part is established so that the transfer characteristics of said expanded light-blocking part during exposure are substantially the same as those in said translucent phase-shift part.

If the surface area of said expanded light-blocking part is S5, the surface area of said phase-inverting light transmission part is s, the amplitude transmissivity of said translucent phase-shift film is t, and the amplitude transmissivity of said phase-inverting light transmission part is t', the values of the surface area of said expanded light-blocking part and said phase-inverting light transmission part are established so that the relationship $s/S5=t/t'$ is satisfied.

Additionally, to achieve the above-noted object, the present invention is a halftone phase-shift mask having a light transmission part which passes as is light which is shone onto a substrate onto which is mounted a semiconductor integrated circuit;

a light-blocking part which does not pass said light, therethrough;

a translucent phase-shift part that not only inverts the phase of said light but also attenuates the amplitude of said light, this translucent phase-shift part having a light-blocking part residual defect at which said light-blocking part remains; and an expanded light transmission part that is formed so as to cover said light-blocking part residual defect and which has a phase-inverting light transmission part that inverts the phase of light which passes through the inside said light-blocking part residual defect, with respect to the phase of said light which passes through said light transmission part, wherein the surface area ratio of said expanded light transmission part and said phase-inverting light transmission part is established so that the transfer characteristics of said expanded light transmission part during exposure are substantially the same as those in said translucent phase-shift part.

If the surface area of said expanded light transmission part is S6, the surface area of said phase-inverting light transmission part is s, the amplitude transmissivity of said translucent phase-shift film is t, and the amplitude transmissivity of said phase-inverting light transmission part is t', the values of the surface areas of said expanded light transmission part and said phase-inverting light transmission part are established so that the relationship $s/S6=(1-t)/(1-t')$ is satisfied.

To achieve the above-noted object of providing a method of correcting a defect in a halftone phase-shift mask, the present invention is a method of correcting a defect in a halftone phase-shift mask having a light transmission part which passes as is light which is shone onto a substrate onto which is mounted a semiconductor integrated circuit and a translucent phase-shift part that not only inverts the phase of said light but also attenuates the amplitude of said light, said translucent phase-shift part having a shifter missing part defect at which there is partial loss of the shifter, said method comprising:

a step of deposition so as to form a light-blocking part made of a material that does not pass said light so as to cover said shifter missing part defect;

an etching step of removing, by etching, a partial region within said light-blocking part up to beneath said substrate surface, so as to form a phase-inverting light transmission part that causes the phase of light which passes through said region to be inverted with respect to the phase of light which passes through said light transmission part; and a step of establishing the surface area ratio between said phase-inverting light transmission part and said light-blocking part at a value so that the transfer characteristics of said light-blocking part during exposure are substantially the same as those of said translucent phase-shift part.

The present invention is also a method of correcting a defect in a halftone phase-shift mask having a light transmission part which passes as is light which is shone onto a substrate onto which is mounted a semiconductor integrated circuit and a translucent phase-shift part that not only inverts the phase of said light but also attenuates the amplitude of said light, this translucent phase-shift part having a shifter missing part defect at which there is partial loss of said shifter, said method comprising:

a first etching step of forming an expanded light transmission part by shaping said shifter missing part defect;

a step of deposition so as to form a light-blocking part made of a material that does not pass said light and so as to cover said expanded light transmission part;

a second etching step of removing, up to beneath said substrate surface, a partial region within said light-blocking part, so as to form a phase-inverting light transmission part that causes the phase of light which passes through this region to be inverted with respect to the phase of light which passes through said light transmission part; and a step of establishing the surface area ratio between said expanded light transmission part and said phase-inverting light transmission part at a value so that the transfer characteristics of said expanded light transmission part during exposure are substantially the same as those of said translucent phase-shift part.

The present invention is also a method of correcting a defect in a halftone phase-shift mask having a light transmission part which passes as is light which is shone onto a substrate onto which is mounted a semiconductor integrated circuit and a translucent phase-shift part that not only inverts the phase of said light but also attenuates the amplitude of said light, this translucent phase-shift part having a shifter missing part defect at which there is partial loss of said shifter, this method comprising:

an etching step of removing, up to beneath said substrate surface, a partial region within said shifter missing part defect, so as to form a phase-inverting light transmission part that causes the phase of light which passes through this region to be inverted with respect to the phase of light which passes through said light transmission part; and a step of establishing the surface area of said phase-inverting light transmission part at a value so that a value of a surface area ratio between said phase-inverting light transmission part and said shifter missing part defect is substantially equal to a value of a ratio taken between the transfer characteristics of said shifter missing part defect during exposure and that of said translucent phase-shift part.

The present invention is also a method of correcting a defect in a halftone phase-shift mask having a light transmission part which passes as is light which is shone onto a substrate onto which is mounted a semiconductor integrated circuit and a translucent phase-shift part that not only inverts the phase of said light but also attenuates the amplitude of said light, this translucent phase-shift part having a shifter missing part defect at which there is partial loss of said shifter, this method comprising:

a first etching step of forming an expanded light transmission part by shaping said shifter missing part defect;

a second etching step of removing, up to beneath said substrate surface, a partial region Within said expanded light transmission part, so as to form a phase-inverting light transmission part that causes the phase of light which passes through this region to be inverted with respect to the phase of light which passes through said light transmission part; and a step of establishing the surface area ratio between said expanded light transmission part and phase-inverting light transmission part so that the transfer characteristics of said expanded light transmission part during exposure are substantially the same as those of said translucent phase-shift part.

The present invention is also a method of correcting a defect in a halftone phase-shift mask having a light transmission part which passes as is light which is shone onto a substrate onto which is mounted a semiconductor integrated circuit, a translucent phase-shift part that not only inverts the phase of said light but also attenuates the amplitude of said light, and a light-blocking part that does not pass said light, said translucent phase-shift part having a light-blocking part residual defect at which a part thereof remains, this method comprising:

an etching step of removing, up to beneath said substrate surface, a partial region within said light-blocking residual defect, so as to form a phase-inverting light transmission part that causes the phase of light which passes through this region to be inverted with respect to the phase of light which passes through said light transmission part, and a step of establishing the surface area of said phase-inverting light transmission part at a value so that a value of a surface area ratio between said phase-inverting light transmission part and said light-blocking part residual defect is substantially equal to a value of a ratio taken between the transfer characteristics of said light-blocking residual defect during exposure and that of said translucent phase-shift part.

The present invention is also a method of correcting a defect in a halftone phase-shift mask having a light transmission part which passes as is light which is shone onto a substrate onto which is mounted a semiconductor integrated circuit, a translucent phase-shift part that not only inverts the phase of said light but also attenuates the amplitude of said light, and a light-blocking part that does not pass said light, said translucent phase-shift part having a light-blocking part residual defect at which part of said light-blocking part remains, this method comprising:

a deposition step of forming an expanded light-blocking part so as to cover said light-blocking part residual defect;

an etching step of removing, up to beneath said substrate surface, a partial region within said expanded light-blocking part, so as to form a phase-inverting light transmission part that causes the phase of light which passes through this region to be inverted with respect to said phase of light which passes through said light transmission part, and a step of establishing the surface area ratio between said expanded light-blocking part and said phase-inverting light transmission part at a value so that the transfer characteristics of said expanded light-blocking part during exposure are substantially the same as those of said translucent phase-shift part. The present invention is also a method of correcting a defect in a halftone phase-shift mask having a light transmission part which passes as is light which is shone onto a substrate onto which is mounted a semiconductor integrated circuit, a translucent phase-shift part that not only inverts the phase of said light but also attenuates the amplitude of said light, and a light-blocking part that does not pass said light, said translucent phase-shift part having a light-blocking part residual defect at which part of said light-blocking part remains, this method comprising:

a first etching step of forming an expanded light transmission part by shaping said light-blocking part residual defect;

a deposition step of forming an expanded light-blocking part by burying said expanded light transmission part with a material that does not pass said light;

a second etching step of removing, up to beneath said substrate surface, a partial region within said expanded light-blocking part, so as to form a phase-inverting light transmission part that causes the phase of light which passes through 1his region to be inverted with respect to the phase of light which passes through said light transmission part, and a step of establishing the surface area ratio between said expanded light-blocking part and said phase-inverting light transmission part at a value so that the transfer characteristics of said expanded light-blocking part during exposure are substantially the same as those of said translucent phase-shift part. The present invention is also a method of correcting a defect in a halftone phase-shift mask having a light transmission part which passes as is light which is shone onto a substrate onto which is mounted a semiconductor integrated circuit, a translucent phase-shift part that not only inverts the phase of said light but also attenuates the amplitude of said light, and a light-blocking part that does not pass said light, said translucent phase-shift part having a light-blocking part residual defect at which part of said light-blocking part remains, this method comprising:

a first etching step of forming an expanded light transmission part by shaping said light-blocking part residual defect;

a second etching step of removing, up to beneath said substrate surface, a partial region within said expanded light transmission part, so as to form a phase-inverting light transmission part that causes the phase of light which passes through this region to be inverted with respect to the phase of light which passes through said light transmission part, and a step of establishing the surface area ratio between said expanded light transmission part and said phase-inverting light transmission part at a value so that the transfer characteristics of said expanded light transmission part during exposure are substantially the same as those of said translucent phase-shift part.

The above-noted etching can be performed direct etching by blowing with a laser beam or by means of focused ion beam milling, or by gas assisted focused beam etching which uses at least one gas that is a fluorine or chlorine based gas.

The above-noted deposition can be performed by direct deposition using a focused ion beam, or by gas assisted focused beam deposition which uses a least one gas that is a hydrocarbon-based based gas or a metallic carbonyl gas.

In the present invention having a constitution as described above, in the case in which a shifter missing part defect in which part of the translucent phase-shift part is missing, or a light-blocking part residual defect in which a light-blocking part remains in the translucent phase-shift part, a phase-inverting light transmission part which causes an inversion of the phase of light passing therewithin with respect to light passing through the light transmission part is provided in the part in which the shifter missing part defect or light-blocking part residual defect occurs, and further the area thereof is established as a prescribed value, resulting in the transfer characteristics in the part in which the shifter missing part defect or light-blocking part residual defect occurred being substantially the same as in the translucent phase-shift part.

For this reason, the halftone phase-shift mask having the shifter missing part defect or light-blocking part residual defect is accurately corrected, without sacrificing the photoresist pattern transfer characteristics thereof.

BRIEF DESCRIPTION OF THE DRAWINGS

FIG. 2 is a drawing which illustrates the principle of a halftone phase-shift mask which is shown in FIG. 1.

FIG. 10 is a process diagram which shows the eighth embodiment of a halftone phase-shift mask defect correction method according to the present invention.

FIG. 11 is a process diagram which shows the ninth embodiment of a halftone phase-shift mask defect correction method according to the present invention.

FIG. 12 is a process diagram which shows the tenth embodiment of a halftone phase-shift mask defect correction method according to the present invention.

FIG. 13 is a process diagram which shows the eleventh embodiment of a halftone phase-shift mask defect correction method according to the present invention.

FIG. 14 is a process diagram which shows the twelfth embodiment of a halftone phase-shift mask defect correction method according to the present invention.

FIG. 16 is a process diagram which illustrates the fourteenth embodiment of a method of correcting a defect in a halftone phase-shift mask according to the present invention.

FIG. 17 is a process diagram which illustrates the fifteenth embodiment of a method of correcting a defect in a halftone phase-shift mask according to the present invention.

FIG. 18 is a drawing which illustrates the configuration of a halftone phase-shift mask that is disclosed in the Japanese Unexamined Patent Publication No. 4-136854, (a) being a cross-sectional view of the halftone phase-shift mask;, (b) being a drawing which shows the amplitude of light that passes through the halftone phase-shift mask shown in (a), and (c) being a drawing which shows the light intensity distribution on a wafer.

DETAILED DESCRIPTION OF THE PREFERRED EMBODIMENTS

Embodiments of present invention are described below, with reference being made to the relevant accompanying drawings.

Figure 1:
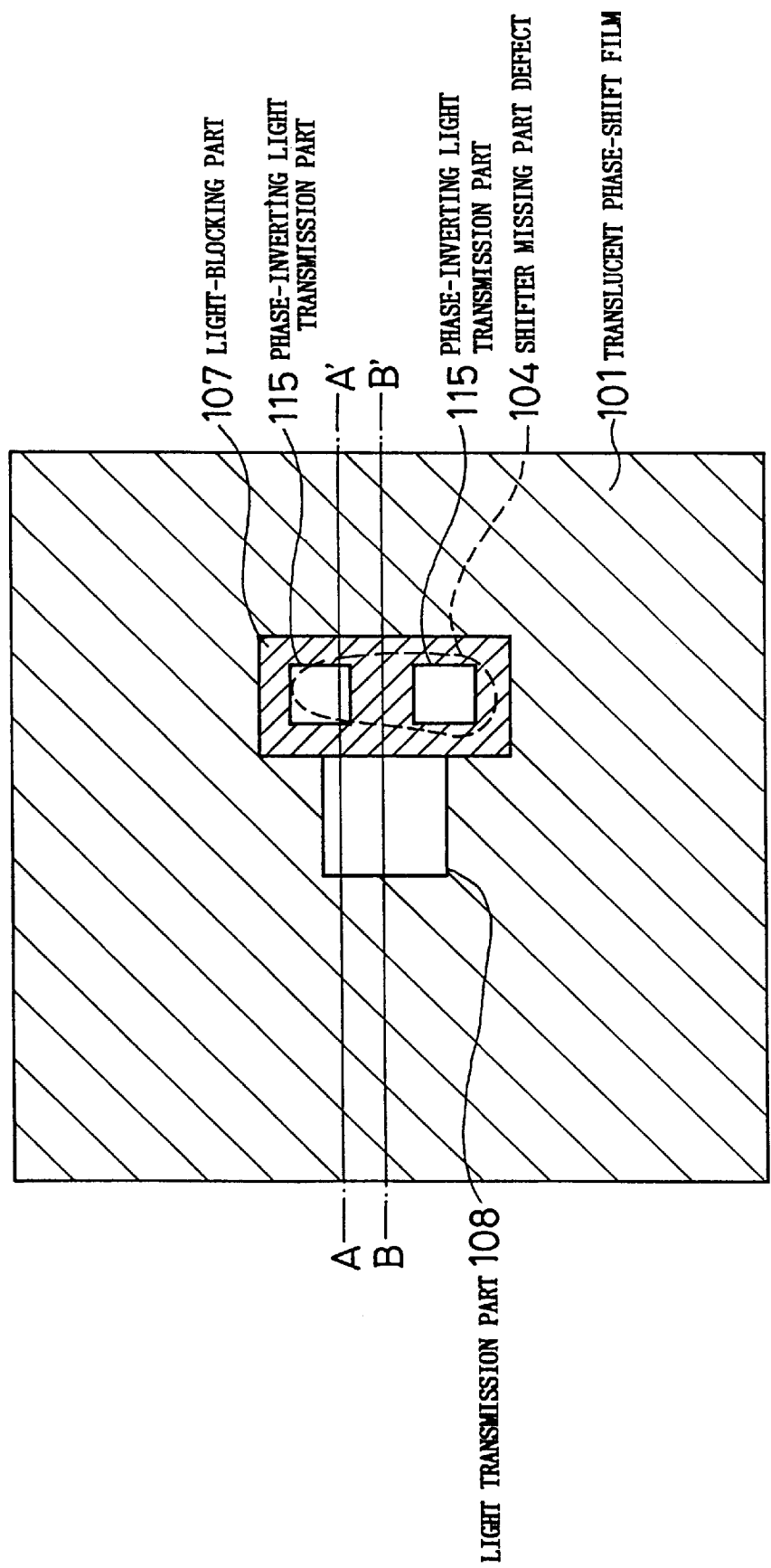
FIG. 1 is a top plan view of the first embodiment of a halftone phase-shift mask according to the present invention.

FIG. 1 is a top plan view which shows the first embodiment of a halftone phase-shift mask according to the present invention.

As shown in FIG. 1, this embodiment has a light transmission part 108 which passes light that is radiated onto a transparent substrate (not shown in the drawing) as is, a translucent phase-shift film 101 that not only inverts the phase of light that strikes the transparent substrate, but also attenuates the amplitude thereof, and a light-blocking part 107 that is formed so as to cover a shifter missing part defect 104, and which blocks light that is radiated onto the transparent substrate.

Inside the light-blocking part 107 is provided a phase-inverting light transmission part 115 that inverts the phase of light radiated onto the transparent substrate and radiates it onto the light transmission part 108.

In a halftone phase-shift mask having the configuration described above, when light is radiated onto the transparent substrate, at the translucent phase-shift film 101 the amplitude of the light is attenuated, and also its phase is inverted.

At the phase-inverting light transmission part 115, the phase of the light that passes therewithin is inverted with respect to the light that passes through the light transmission part 108. For this reason, the light that passes through the translucent phase-shift film 101 or the phase-inverting light transmission part 115 has a phase that is inverted with respect to the light that passes through the light transmission part 108.

In the shifter missing part defect 104, because it is covered by the light-blocking part 107 and the phase-inverting light transmission part 115, it is not possible to see the shape of this part at the top surface of the halftone phase-shift mask.

FIG. 2 is a drawing presented to illustrate the principle of the halftone phase-shift mask which is shown in FIG. 1, in which (a) is a crosssectional view along the line A–A' in FIG. 1, and (b) is a drawing which shows the amplitude transmissivity distribution of light that passes through the halftone phase-shift mask.

In this embodiment, as shown in FIG. 2 (a), a translucent phase-shift film 101 is deposited over the transparent substrate 114. The translucent phase-shift film 101 is a single-layer or multiple-layer film made of chrome, a chrome oxide, a chrome oxide/nitride, a chrome fluoride, molybdenum silicide, a molybdenum silicide oxide, a molybdenum silicide oxide/nitride, or a molybdenum silicide fluoride.

When fabricating this film, conditions that are required of the translucent phase-shift film 101 are that it has a transmissivity of 1 to 30% with respect to exposure light and that it inverts the phase of passed exposure light by 180 degrees.

Within the light-blocking part 107, there is formed a phase-inverting light transmission part 115 so as to bury the shifter missing part defect 104. The light-blocking part 107 is formed as a carbon film or a metallic film or the like by, for example, FIB gas assisted deposition.

At the phase-inverting light transmission part 115, by digging into the transparent substrate 114, the phase of the transmitted light is inverted with respect to light that passes through the light transmission part 108.

If FIB etching is used to dig into the transparent substrate 114, gallium or other ions are implanted, although the value of amplitude transmissivity T' of the phase-inverting light transmission part 115 decreases slightly, after etching it is possible to perform wet etching using an alkaline solution to remove this.

When the transparent substrate 114 is dug into, the effect of the side walls thereof substantially lowers the intensity transmissivity T' thereof.

Figure 3:
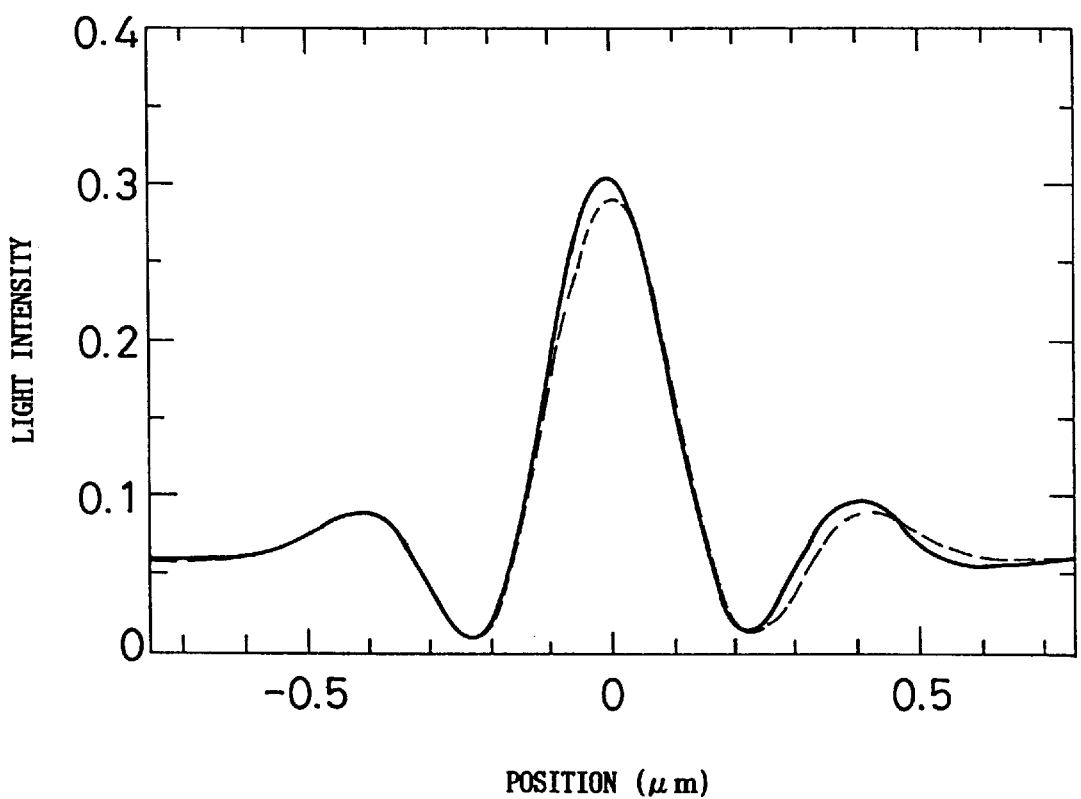
FIG. 3 is a drawing which shows the light intensity distribution on the photoresist film for the cases of using the halftone phase-shift masks which are shown in FIG. 1 and FIG. 21.
Figure 21:
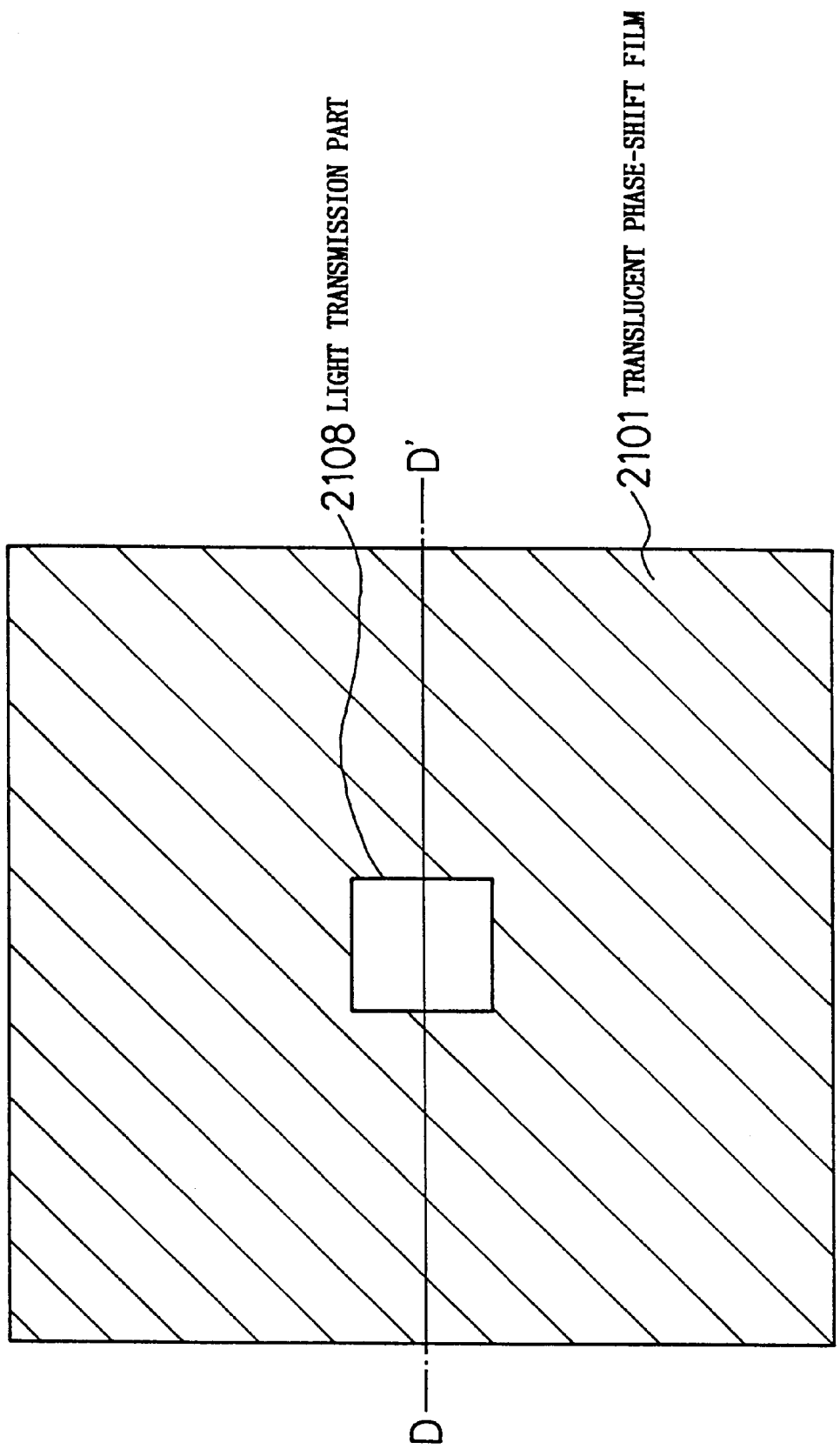
FIG. 21 a top plan view which shows an example of the configuration of a halftone phase-shift mask without a shifter missing part defect.
Figure 22:
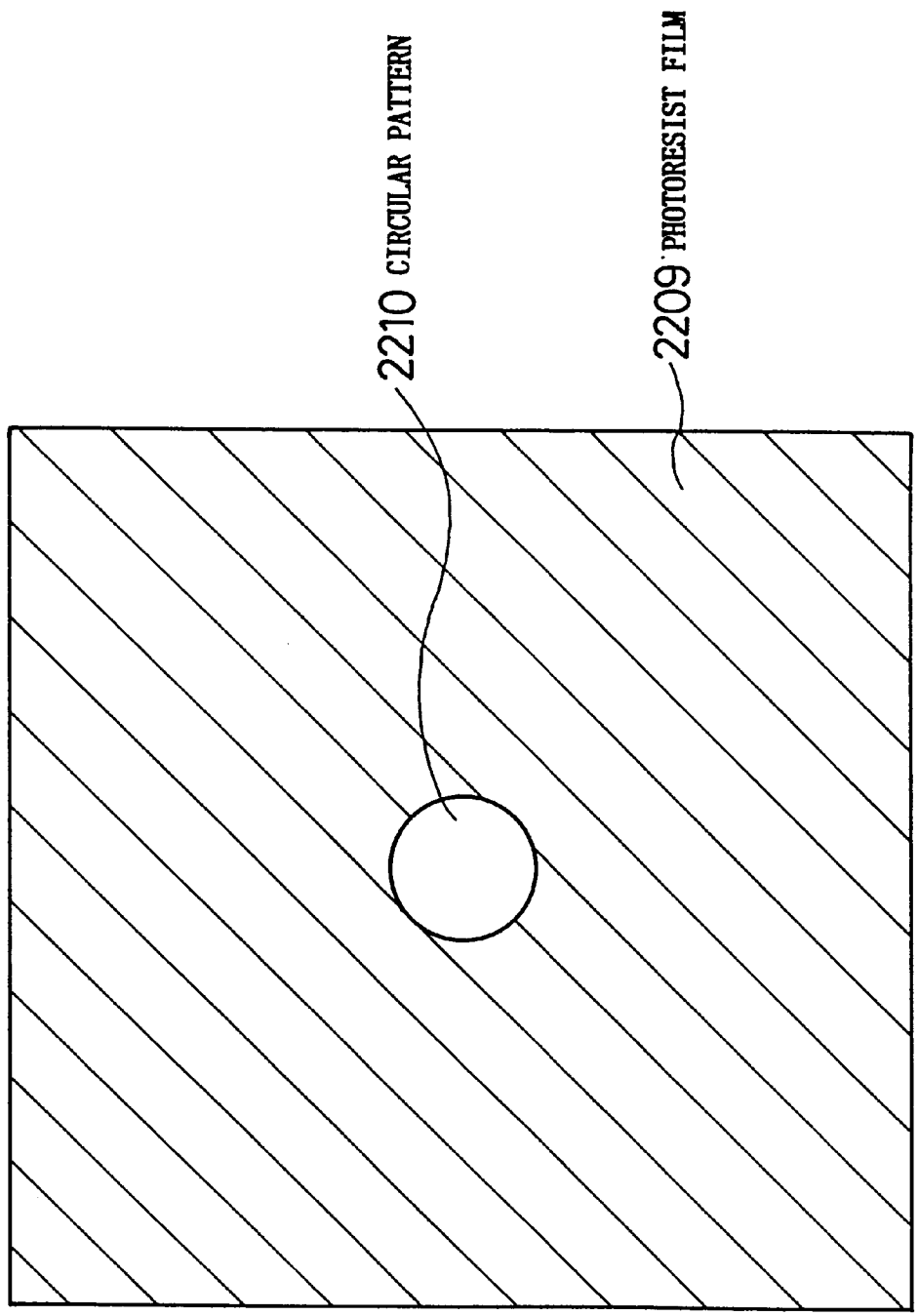
FIG. 22 is a drawing which shows the photoresist transfer pattern for the case of using the halftone phase-shift mask which is shown FIG. 21.
Figure 23:
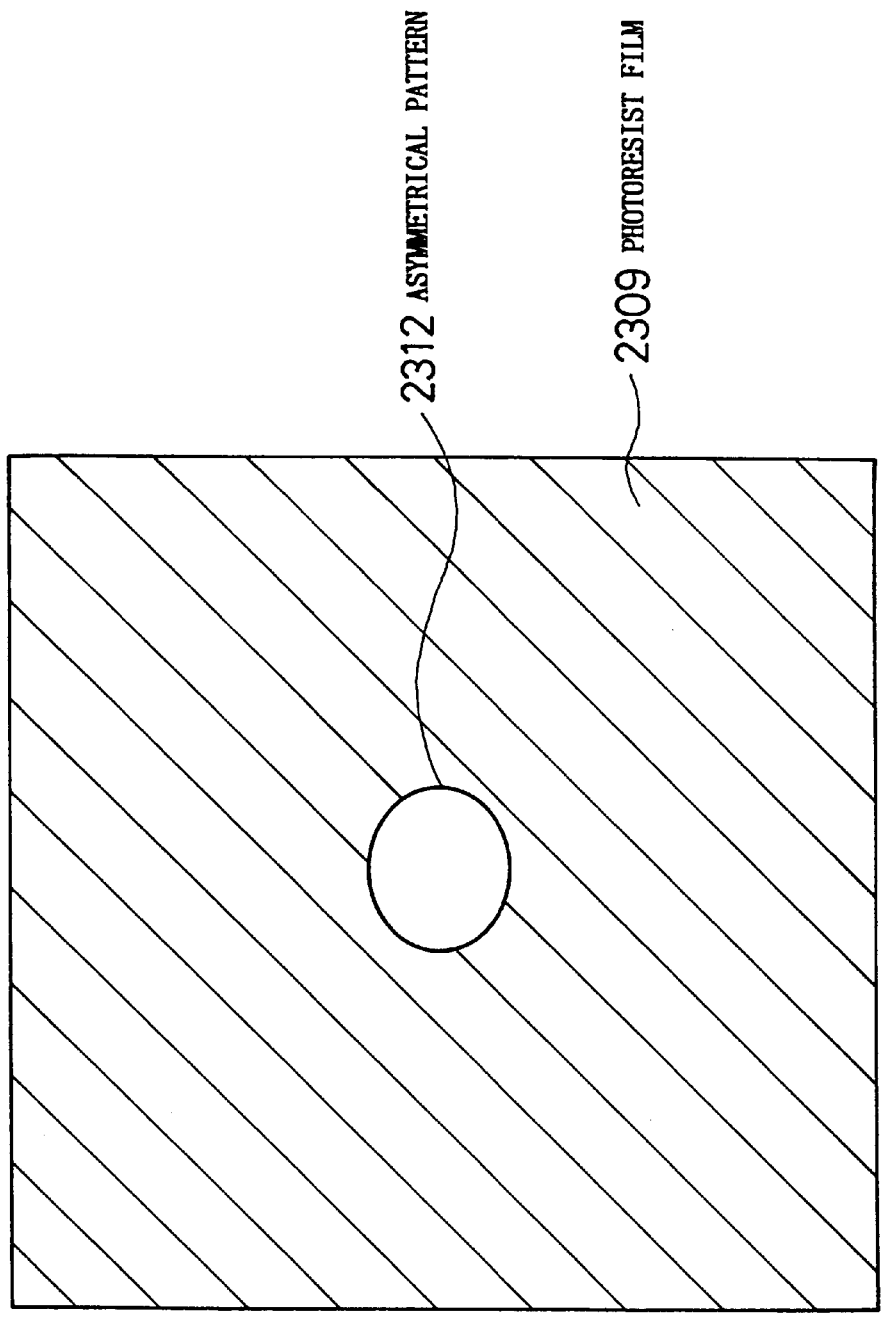
FIG. 23 is a drawing which shows the photoresist transfer pattern for the case of using the halftone phase-shift mask which is shown in FIG. 20.

FIG. 3 is a drawing which shows the light intensity distribution on the photoresist film for the case of using the halftone phase-shift masks which are shown in FIG. 1 and FIG. 21.

In this drawing, the solid line represents the exposure light intensity on the photoresist film along the cross section A–A' indicated in FIG. 1, while the dashed line represents the dashed line represents the exposure light intensity on the photoresist film along the cross section D–D' indicated in FIG. 21. The exposure conditions are the same as indicated in case of FIG. 24.

Figure 24:
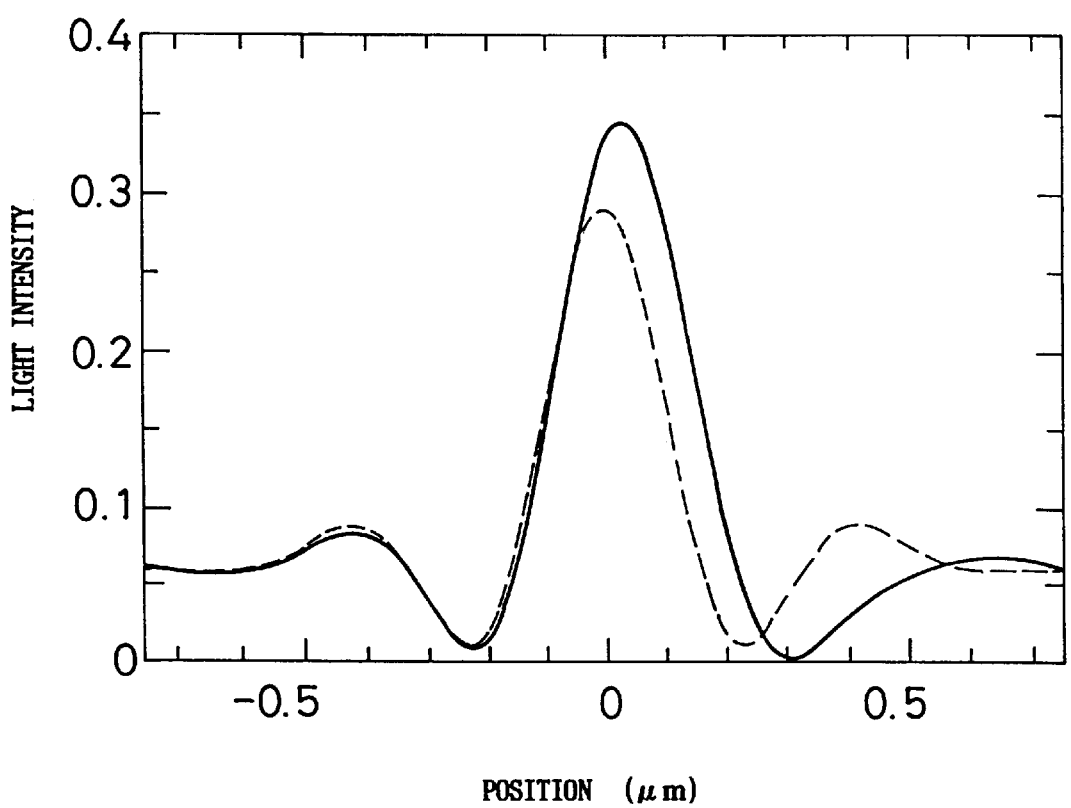
FIG. 24 is a drawing which shows the light intensity distribution on the photoresist film using the halftone phase-shift masks which are shown in FIG. 20 and FIG. 21.
Figure 25:
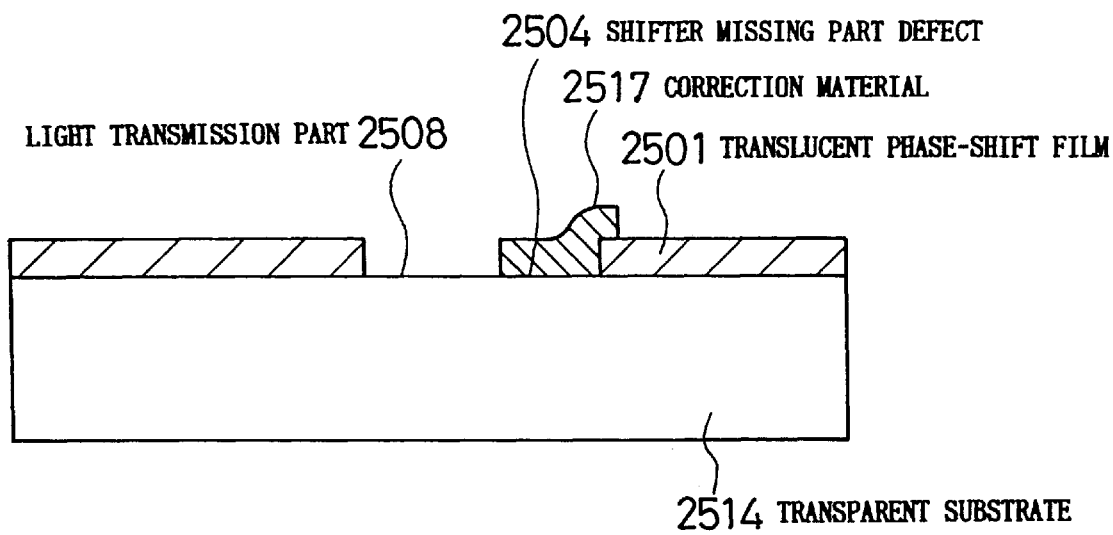
FIG. 25 is a cross-sectional view which shows the configuration of a halftone phase-shift mask to which the defect correction method that is disclosed in the Japanese Unexamined Patent Publication No. 7-146544 has been applied.
Figure 26:
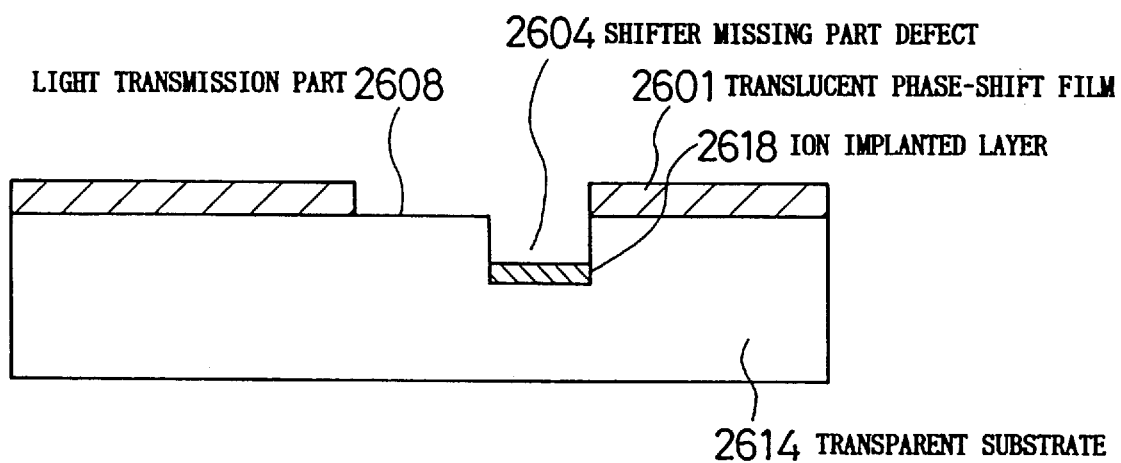
FIG. 26 is a cross-sectional view which shows the configuration of a halftone phase-shift mask to which the defect correction method that is disclosed in the Japanese Unexamined Patent Publication No. 7-219211 has been applied.
Figure 27:
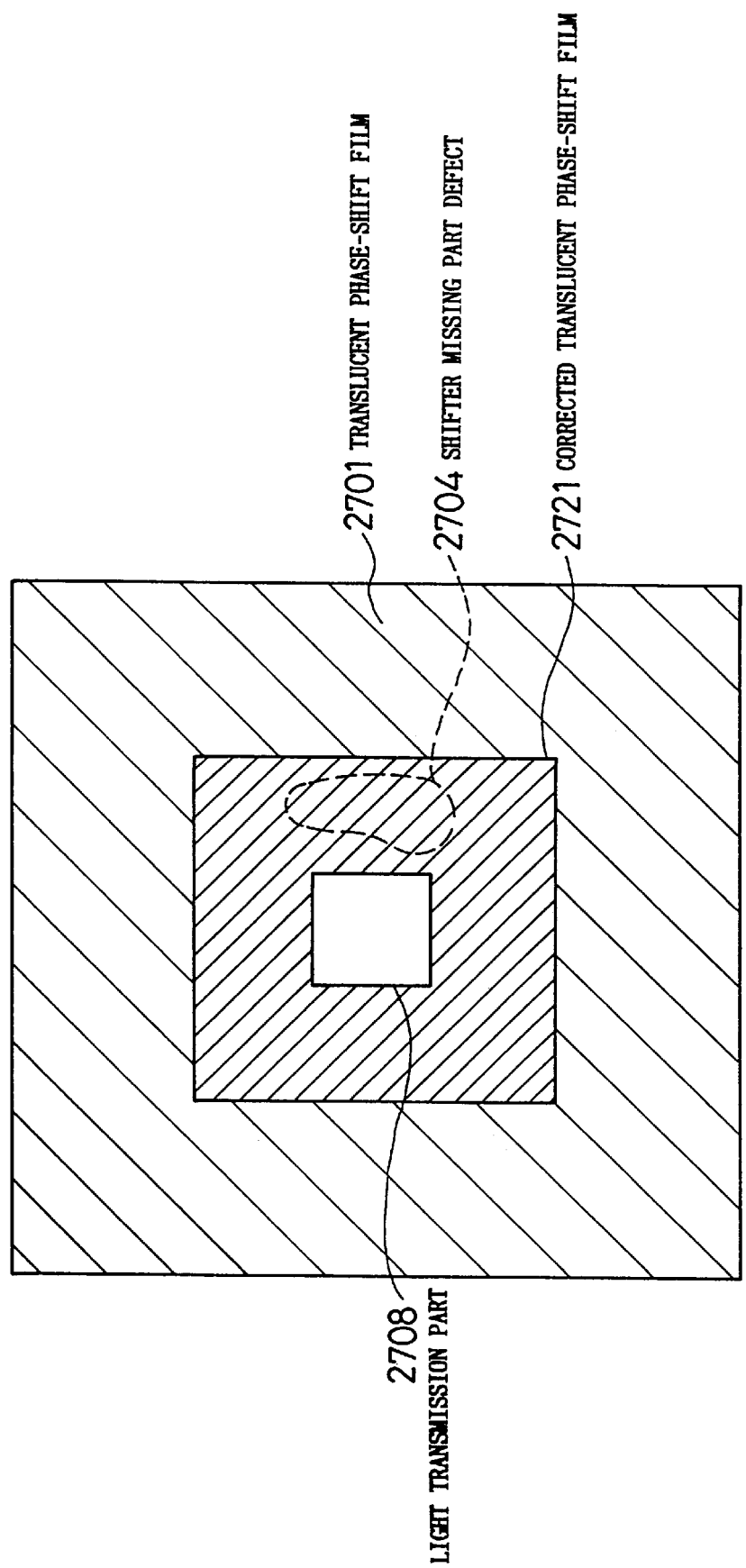
FIG. 27 is a top plan view which shows the configuration of a halftone phase-shift mask to which the defect correction method that is disclosed in the Japanese Unexamined Patent Publication No. 7-295204 has been applied.

Comparing FIG. 3 and FIG. 24, it can be seen that light intensity distribution on the photoresist film in the case of using the halftone phase-shift mask of this embodiment of the present invention is extremely similar to the light intensity distribution on the photoresist film in the case of using a normal halftone phase-shift mask.

For this reason, in the case of using a halftone phase-shift mask after the correction of a defect therein, it is possible to use a resist transfer pattern that is approximately the same shape as the case of using a normal halftone phase-shift mask.

The reason this phenomenon occurs is illustrated in FIG. 2.

As shown in FIG. 2 (a), in this embodiment on the inner side of the light-blocking part 107 there is formed a phase-inverting light transmission part 115 that inverts the phase of the light that passes therewithin, with respect to the light that passes through the light transmission part 108.

The size of this phase-inverting light transmission part 115 is 0.625 $\mu$m, this being small compared to the size of the light transmission part 108, which is 1.25 $\mu$m.

In the case of using an exposure light source wavelength 1, and a projection lens NA, the resolution R of the system is as follows.

$$R = k \lambda/NA$$

In the above equation, k is a coefficient is a process-dependent coefficient which, in the case of a high-resolution lens, would be approximately 0.5.

If $\lambda=0.248$ $\mu$m and NA=0.5 are substituted, R is approximately 0.25 $\mu$m.

This is the size at the wafer, and to convert to the size at the mask, this is divided by the magnification M=⅕, making the resolution 1.25 $\lambda$m.

That is, a feature smaller than 1.25 $\mu$m on the mask will not be resolved. For this reason, although the light transmission part 108 is resolved at the mask, the phase-inverting light transmission part 115 is not resolved.

Because the phase-inverting light transmission part 115 is a micropattern, if the associated transmitted light is diffracted, although the diffracted and transmitted light is almost completely ignored by the projection lens, the 0th order component transmitted light passes through the center of the projection lens as is.

For this reason, although the phase-inverting light transmission part 115 is not resolved, there is an influence on the image-forming characteristics of the light transmission part 108.

In order to generate a 0th order component the same size as the halftone phase-shift mask 101, it is necessary to adjust the surface area ratio between the light-blocking part 107 and the phase-inverting light transmission part 115.

If the surface area of the light-blocking part 107 (including the phase-inverting light transmission part 115) is S, the surface area of the phase-inverting light transmission part 115 is s, the amplitude transmissivity of the translucent phase-shift film 101 is t=-$T^{1/2}$, and the amplitude transmissivity of the phase-inverting light transmission part 115 is t'=-$T'^{1/2}$, to achieve a 0th order component the same size as the translucent phase-shift film 101, it is sufficient to make tS=t's, that is, to make s/S=t/t'.

If the intensity transmissivity T of the translucent phase-shift film 101 is 6% and the intensity transmissivity T' of the phase-inverting light transmission part 115 is 100%, s/S is approximately 25%.

In the halftone phase-shift mask that is shown in FIG. 1, the surface area ratio between the light-blocking part 107 and the phase-inverting light-blocking part 115 is 3:1.

This being the case, in the transmitted light amplitude shown by the solid line in FIG. 2 (*b*), microfeatures that are smaller than the resolving limit are ignored, so that the transfer characteristics are substantially equivalent to the transmitted light amplitude with the surface area averaged.

Figure 4:
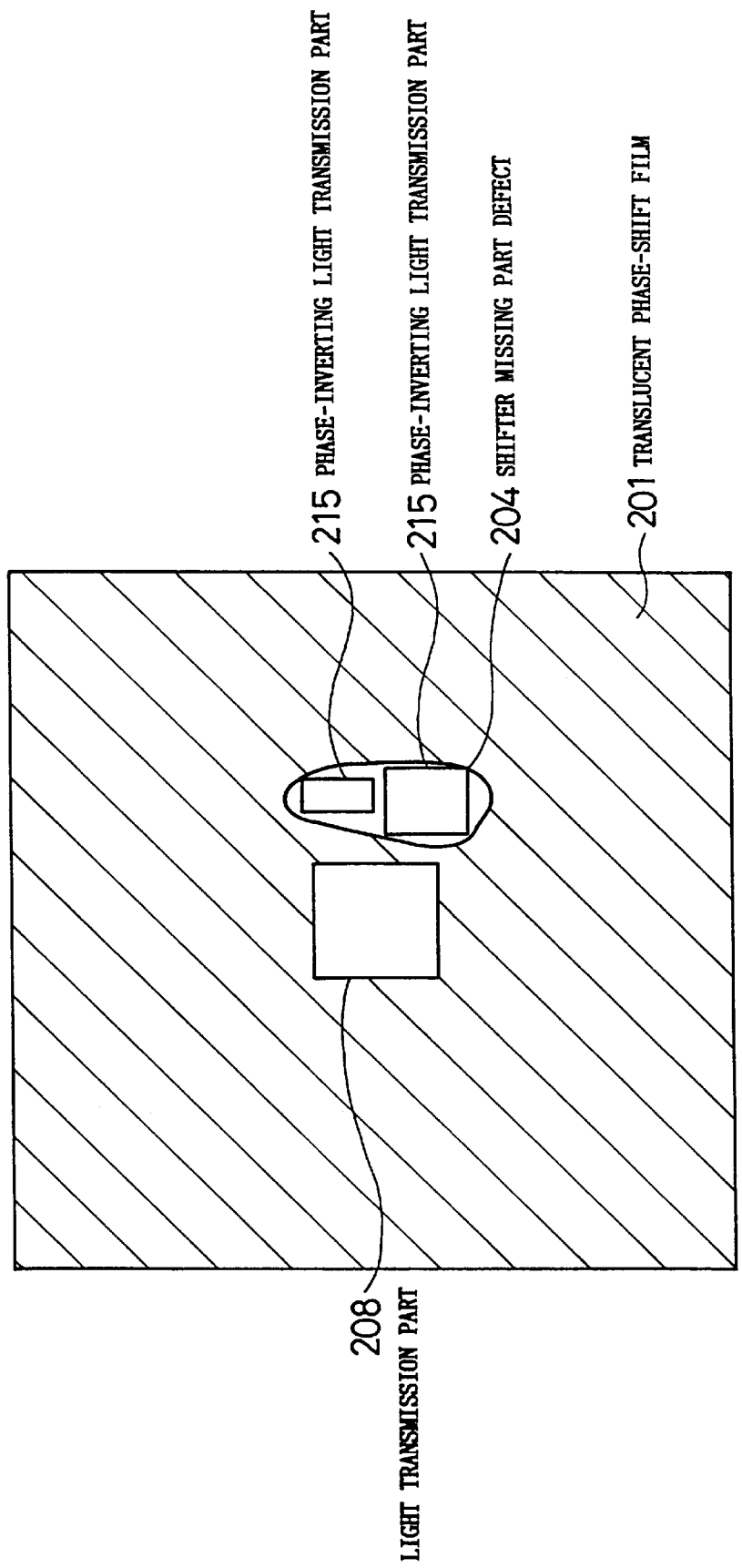
FIG. 4 is a top plan view which shows the second embodiment of a halftone phase-shift mask according to the present invention.

FIG. 4 is a top plan view which shows the second embodiment of a halftone phase-shift mask according to the present invention.

As shown in FIG. 4, in this embodiment no light-blocking part is used, a phase-inverting light transmission part 215 being directly formed within the shifter missing part defect 204 so as to invert the phase of light which passes therethrough with respect to light which passes through the light transmission part 208. For this reason, it is possible to eliminate the process step of forming the light-blocking part.

With this configuration, if the surface area of the phase-inverting light transmission part 215 is s and the surface area of the shifter missing part defect 204 is S2, within the shifter missing part defect 204, the surface area having the same phase and transmissivity as the light transmission part 208 is S2-s. For this reason, the condition for required for the 0th component to be equal to the translucent phase-shift film 201 is $tS2=t's+(S2-s)$, that is $s/S2=(1-t)/(1-t')$ If T is 6% and T' is 100%, s/S2 is approximately 62%. This is the optimum condition for the surface area of the phase-inverting light transmission part to achieve the same characteristics as if there were no shifter missing part defect even in a halftone phase-shift mask having a shifter missing part defect.

However, because the shape of the shifter missing part defect 204 is irregular, the calculation of the surface area thereof is difficult, and there is a loss of performance as a translucent phase shift mask at the boundary thereof. Next, the third embodiment of a halftone phase-shift mask according to the present invention, this having a shifter missing part defect that has been priorly expanded, will be described.

Figure 5:
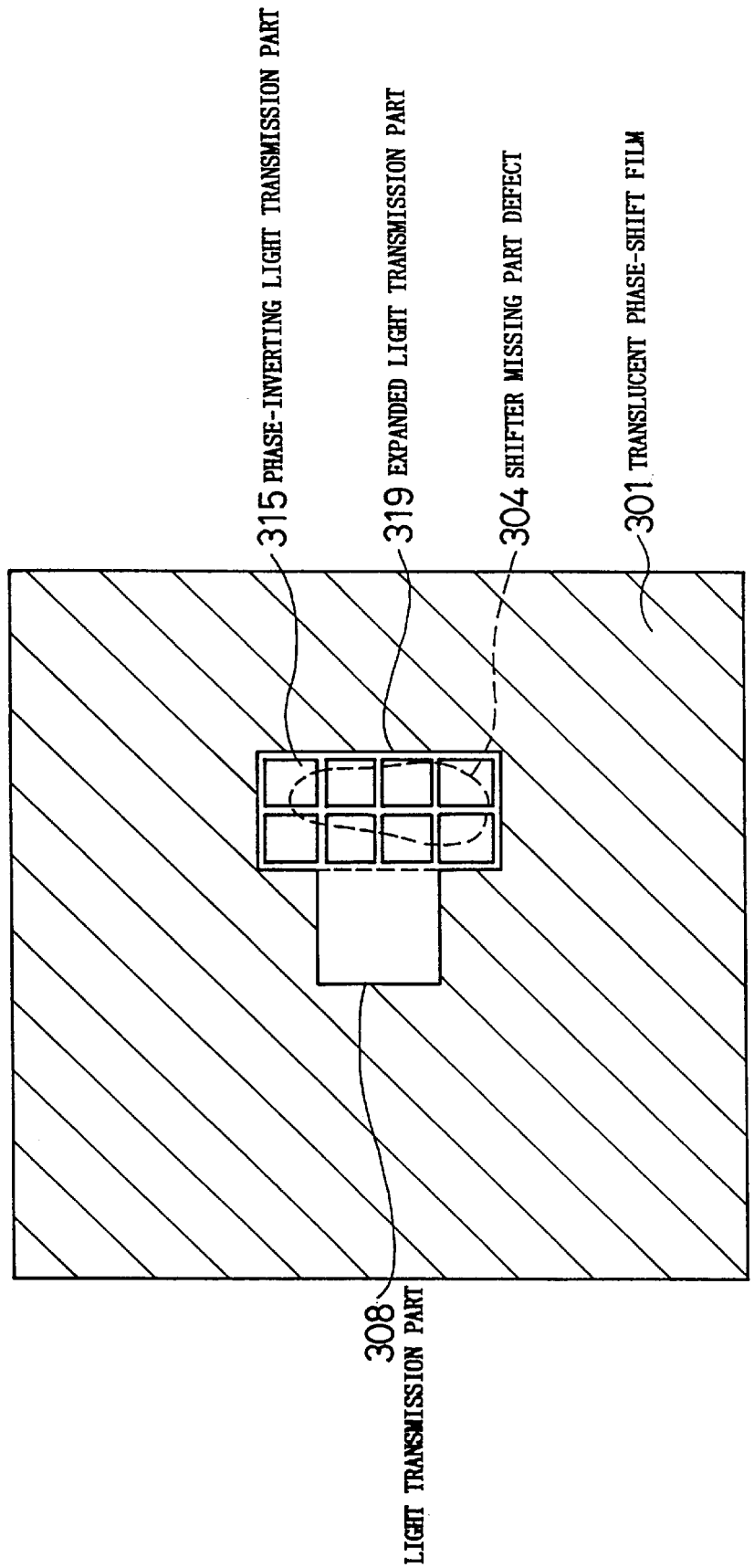
FIG. 5 is a top plan view which shows the third embodiment of a halftone phase-shift mask according to the present invention.

FIG. 5 is a top plan view which shows the third embodiment of a halftone phase-shift mask according to the present invention.

As shown in FIG. 5, the shifter missing part defect 304 is expanded beforehand, using laser blowing or the like to form an expanded shape, this forming an expanded light transmission part 319 so as to cover the shifter missing part defect 304.

Then, within the above-noted expanded light transmission part 319, a phase-inverting light transmission part 315 is formed that inverts the phase of light passing therethrough with respect to light that passes through the light transmission part 308.

If the surface area of the expanded light transmission part 319 is S3 and the surface area of the phase-inverting light transmission part 315 is s, the optimum surface area ratio in this embodiment is $s/S3=(1-t)/(1-t')$.

This optimum surface area ratio is the ratio for the purpose of achieving characteristics in a halftone phase-shift mask in which a shifter missing part defect has occurred that are equivalent to one in which there is no shifter missing part defect.

In the above-described first to third embodiments, the description was in the case of a correction of a shifter missing part defect. The present invention applies as well to the case in which a light-blocking part residual defect occurs in a halftone phase-shift mask, this case being described in the embodiments to follow.

Figure 6:
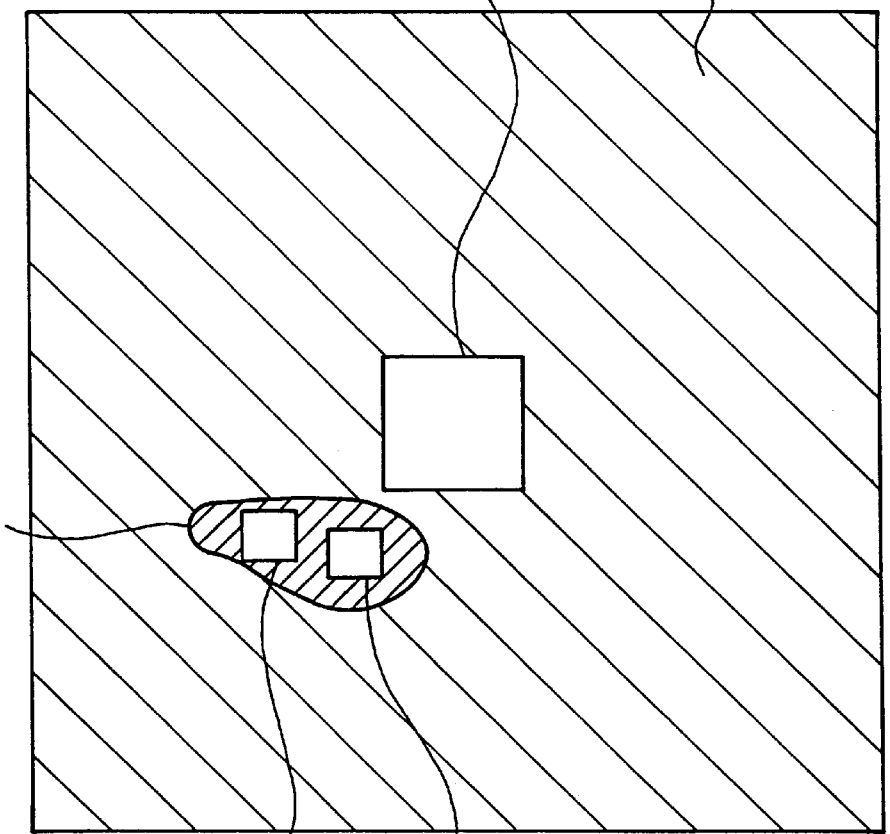
FIG. 6 is a top plan view which shows the fourth embodiment of a halftone phase-shift mask according to the present invention.

FIG. 6 is a top plan view which shows the fourth embodiment of a halftone phase-shift mask according to the present invention.

As shown in FIG. 6, within the light-blocking part residual defect 405 is formed a phase-inverting light transmission part 415 that inverts the phase of light which passes therethrough with respect to light that passes through the light transmission part 408.

If the surface area of the light-blocking part residual defect 405 is S4 and the surface area of the phase-inverting light transmission part 415 is s, the optimum surface area ratio is $s/S4=t/t'$.

However, at the boundary of this light-blocking part residual defect 405, because of the irregular shape thereof, the calculation of the surface area thereof is difficult.

The above being the case, the fifth embodiment of a halftone phase-shift mask according to the present invention is one in which the light-blocking part is used to form an expanded light-blocking part residual defect beforehand, this embodiment being described below.

Figure 7:
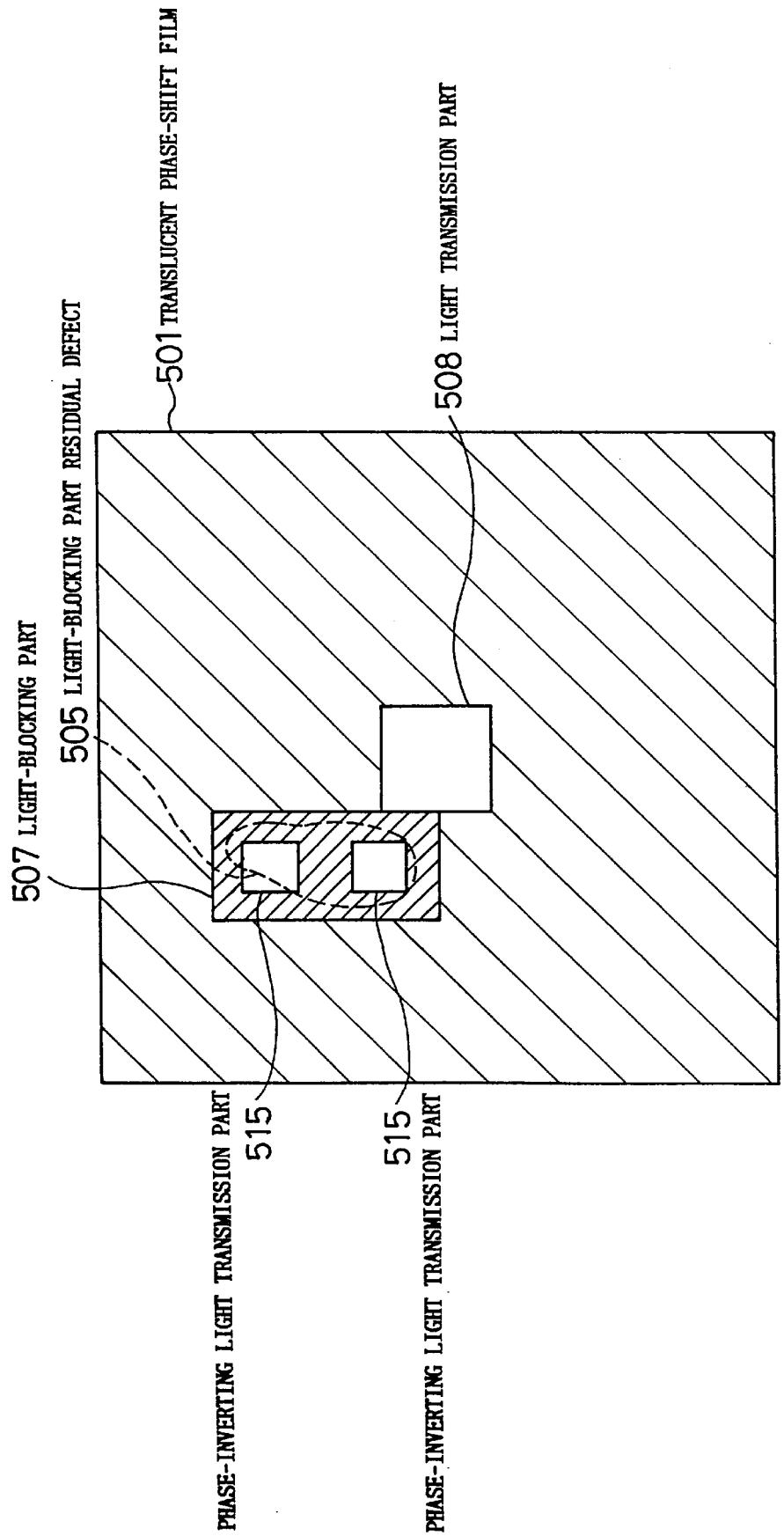
FIG. 7 is a top plan view which shows the fifth embodiment of a halftone phase-shift mask according to the present invention.

FIG. 7 is a top plan view which shows the fifth embodiment of a halftone phase-shift mask according to the present invention.

As can be seen in FIG. 7, in this embodiment an expanded light-blocking part residual defect is formed beforehand by providing a light-blocking part 507 around the periphery of the light-blocking part residual defect 505, after which a phase-inverting light transmission part 515 is formed therewithin which inverts the light that passes therewithin with respect to light that passes through the light transmission part 508.

If the surface area of the light-blocking part residual defect 505 is S5 and the surface area of the phase-inverting light transmission part 515 is s, the optimum surface area ratio is .

$s/S5=t/t'$.

Figure 8:
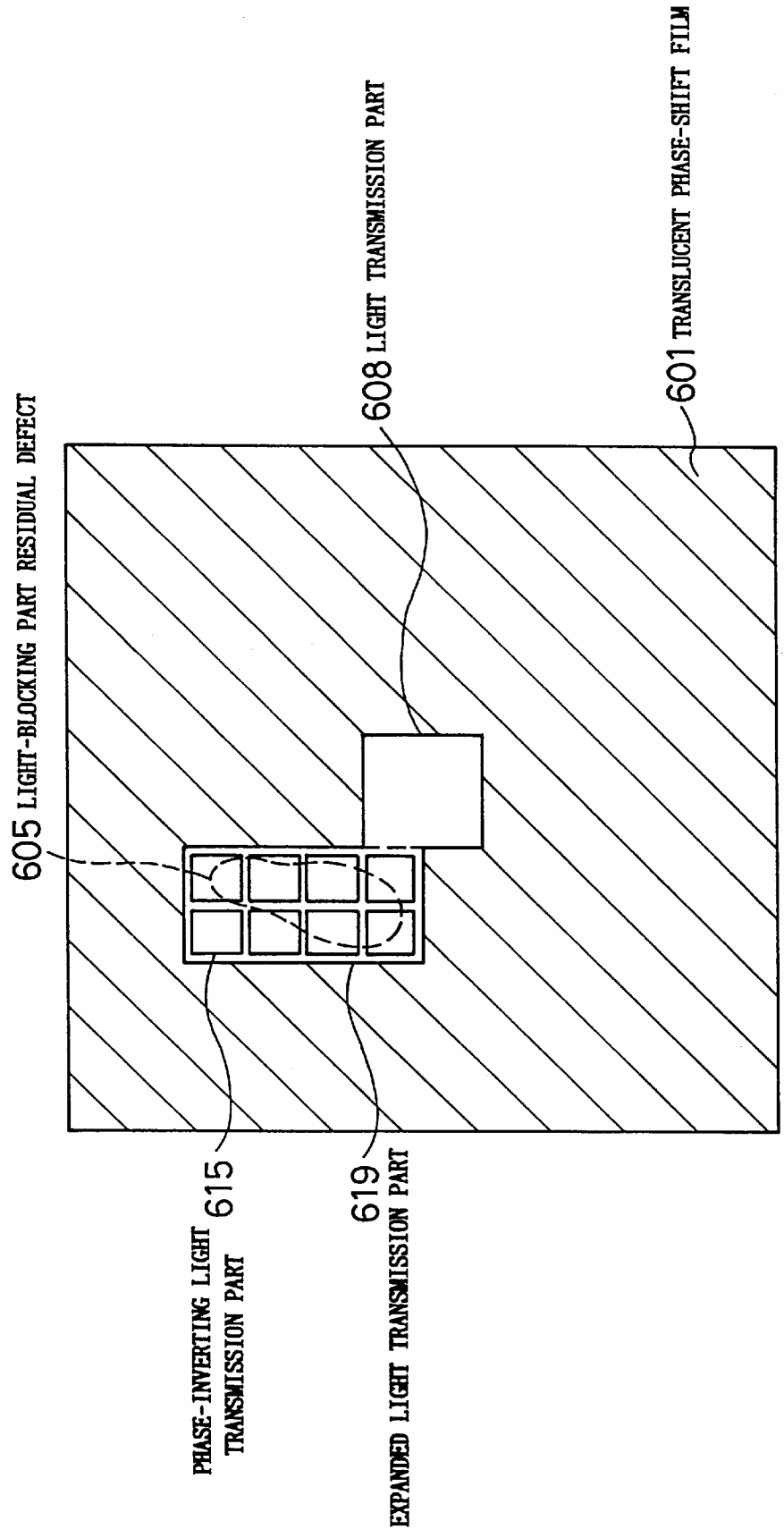
FIG. 8 is a top plan view which shows the sixth embodiment of a halftone phase-shift mash according to the present invention.

FIG. 8 is a top plan view which shows the sixth embodiment of a halftone phase-shift mask according to the present invention.

As can be seen in FIG. 8, in this embodiment the translucent phase-shift film 601 around the periphery of the light-blocking part residual defect 605 is removed, thereby forming an expanded light transmission part 619, after which a phase-inverting light transmission part 615 is formed therewithin which inverts the phase of light that passes therewithin with respect to light that passes through the light transmission part 608.

If the surface area of the expanded light transmission part 619 is S6 and the surface area of the phase-inverting light transmission part 615 is s, the optimum surface area ratio is $s/S6=(1-t)/(1-t')$.

In the above-described embodiments, the description was that for only the case in which the light transmission part was in the shape of a hole. Naturally, the present invention does not impose such a limitation, and can be applied to any shape, relevant embodiments thereof being described below.

Figure 9:
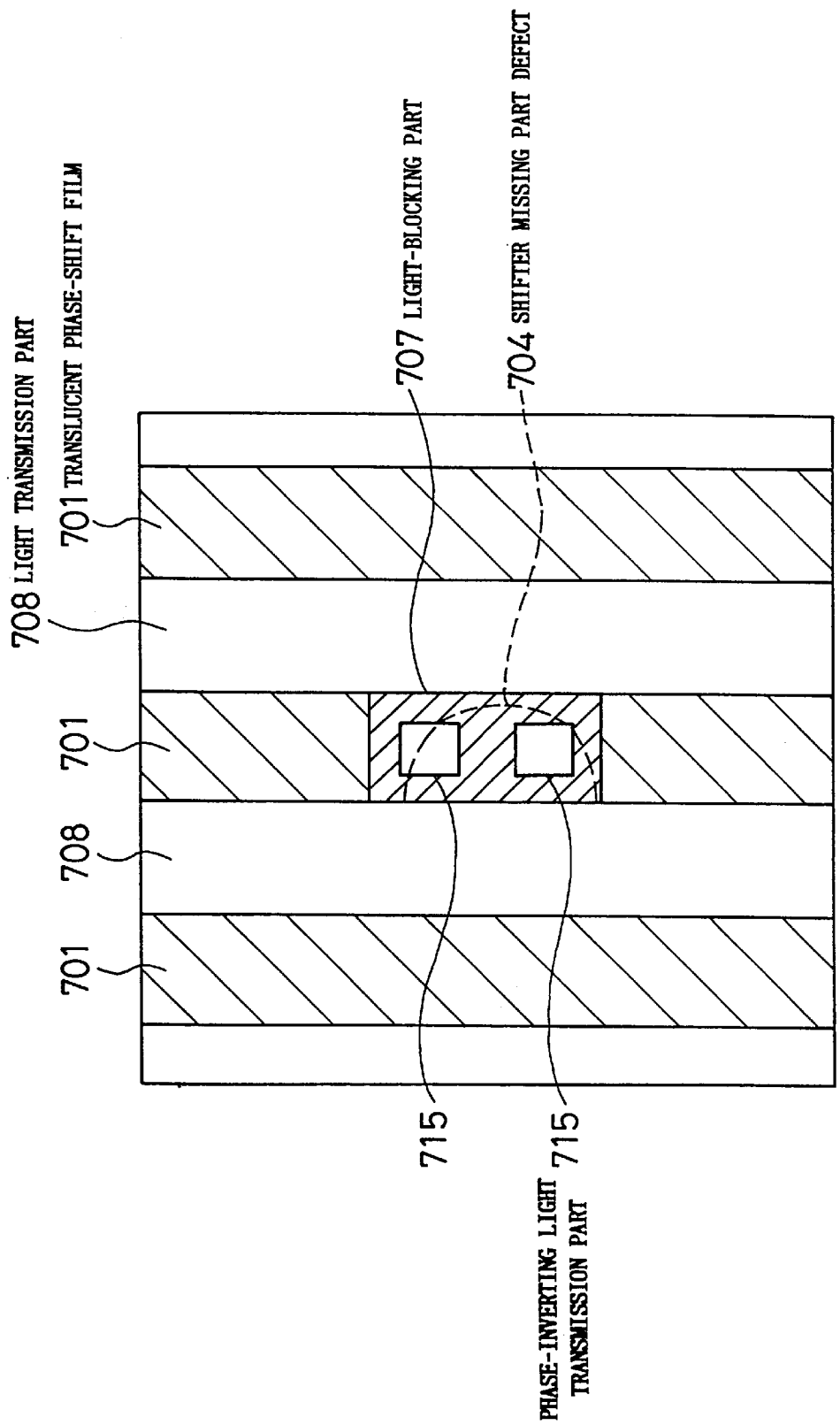
FIG. 9 is a top plan view which shows the seventh embodiment of a halftone phase-shift mask according to the present invention.

FIG. 9 is a top view of the seventh embodiment of a halftone phase-shift mask according to the present invention.

As shown in FIG. 9, in this embodiment the light transmission part 708 is in the shape of a line. In the case in which a shifter missing part defect 704 occurs in such a pattern, similar to the cases described above with regard to other embodiments, it is possible to correct the defect and to preserve the halftone phase-shift mask performance by means of the light-blocking part 707 and the phase-inverting light transmission part 715.

The above have been descriptions of various embodiments of a halftone phase-shift mask according to the present invention.

What follows are description of embodiments of a method of correcting a defect in a halftone phase-shift mask according to the present invention.

FIG. 10 is a process diagram which illustrates a method of correcting a defect in the eight embodiment of a halftone phase-shift mask according to the present invention.

In the halftone phase-shift mask of this eighth embodiment, a shifter missing part defect 804 has occurred, as shown in FIG. 10 (a).

In the part in which the shifter missing part defect 804 occurs, FIB gas assisted deposition is used to deposit a carbon film or a metallic film, thereby forming a light-blocking part 807, as shown in FIG. 10 (b).

Then, FIB gas assisted etching is used to dig through light-blocking part 807 and into the transparent substrate 814, thereby forming a phase-inverting light transmission part 815 that inverts the phase of light passing therethrough with respect to light that passes through the light transmission part 808, as shown in FIG. 10 (c).

The depth of digging will differ, depending upon the material of the transparent substrate 814 and upon the wavelength of the exposure light.

For example, for a transparent substrate 814 of synthetic fused silica glass and an exposure light from a KrF excimer laser, the amount of digging depth would be 248 nm.

Instead of a KrF excimer laser, it is possible to use as an exposure light source the g lay or the i lay of a mercury lamp, an ArF excimer laser, or an F2 excimer laser or the like. Instead of synthetic fused silica glass it is possible to use a variety of glass materials, or crystal materials such as GaF2, Mg2, or LiF or the like as the material for the transparent substrate 814.

Although the gas that is used when performing digging of the transparent substrate 814 using FIB gas assisted etching can be a chlorine based gas or a fluorine gas from the beginning to the end of the etching, to perform accurate control of the digging amount in the phase-inverting light transmission part 815, using the fact that the speed of etching synthetic fused silica glass with a chlorine based gas is slow, it is desirable to etch at first with a chlorine based gas, so as to first expose the surface of the transparent substrate 814, and then to etch the transparent substrate 814 using a fluorine based gas.

FIG. 11 is a process diagram which illustrates a method of correcting a defect in the ninth embodiment of a halftone phase-shift mask according to the present invention.

In this embodiment, first the shifter missing part defect 904 is expanded beforehand, using laser blowing or the like, so as to form the expanded light transmission part 919, as shown in FIG. 11 (b).

Next, FIB gas assisted deposition is used to deposit a light-blocking part 907, as shown in FIG. 11 (c).

Then, using FIB gas assisted etching, a phase-inverting light transmission part 915 is formed within the light-blocking part 907 which inverts the phase of light that passes therewithin with respect to light that passes through the light transmission part 908.

In this embodiment, because it is not necessary in the FIB gas assisted etching to etch the translucent phase-shift film 901, it is possible to improve the uniformity of etching in the process step that exposes the transparent substrate 907 using a chlorine based gas.

FIG. 12 is a process diagram which illustrates a method of correcting a defect in the tenth embodiment of a halftone phase-shift mask according to the present invention.

In this embodiment, as shown in FIG. 12 (b), a phase-inverting light transmission part 1015 is directly formed within the shifter missing part defect 1004. By using this method, it is possible to correct a shifter missing part defect with a small number of process steps.

FIG. 13 is a processing diagram which illustrates a method of correcting a defect in the eleventh embodiment of a halftone phase-shift mask according to the present invention.

In this embodiment, the laser blowing method or the like is first used to process the shifter missing part defect 1104, thereby forming an expanded light transmission part 1119 beforehand, as shown in FIG. 13 (b).

By forming an expanded light transmission part 1108, it is possible to eliminate the missing film parts of the translucent phase-shift film 1101 at the boundary of the shifter missing part defect 1104, and it becomes easy to calculate the surface area of the expanded light transmission part 1119.

Then, within the expanded light transmission part 1119, a phase-inverting light transmission part 1115 is formed that inverts the light of transmitted light with respect to the phase of light that passes through the light transmission part 1108.

While the foregoing descriptions have been with regard to a method of correcting a shifter missing part defect, the present invention can be applied to the case of a light-blocking part residual defect as well, as described below with regard to other embodiments of the present invention.

FIG. 14 is a process diagram which illustrates a method of correcting a defect in the twelfth embodiment of a halftone phase-shift mask according to the present invention.

In the halftone phase-shift mask of this embodiment, a light-blocking part residual defect 1205 has occurred.

By using FIB gas assisted etching in the area in which the light-blocking part residual defect 205 has occurred, a phase-inverting light transmission part 1215 is formed within the light-blocking part residual defect 1205 that inverts the phase of transmitted light with respect to the phase of light that passes through the light transmission part 1208, thereby correcting the light-blocking part residual defect 1205, as shown in FIG. 14 (b).

Figure 15:
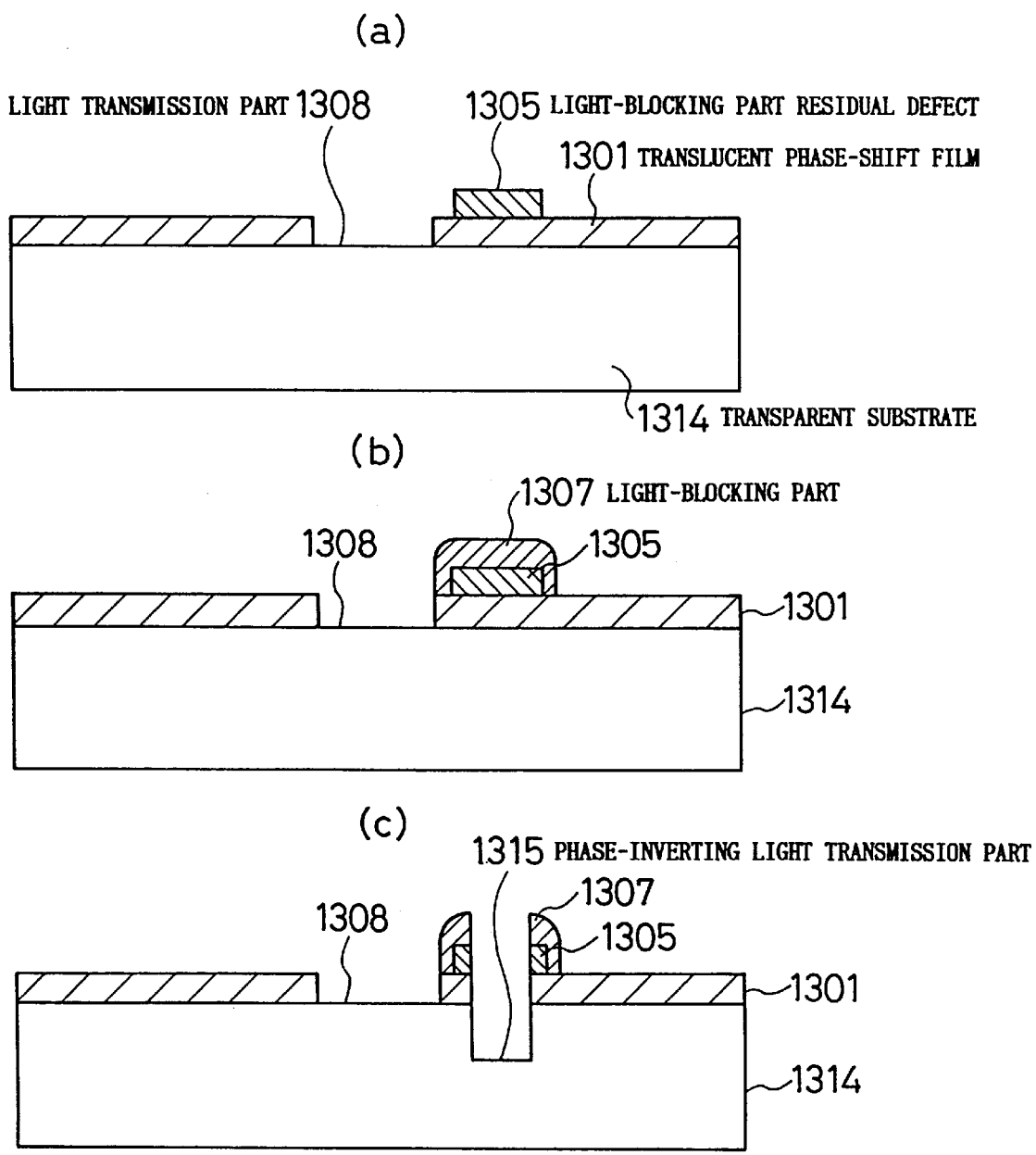
FIG. 15 is a process diagram which illustrates the thirteenth embodiment of a method of correcting a defect in a halftone phase-shift mask according to the present invention.
Figure 19:
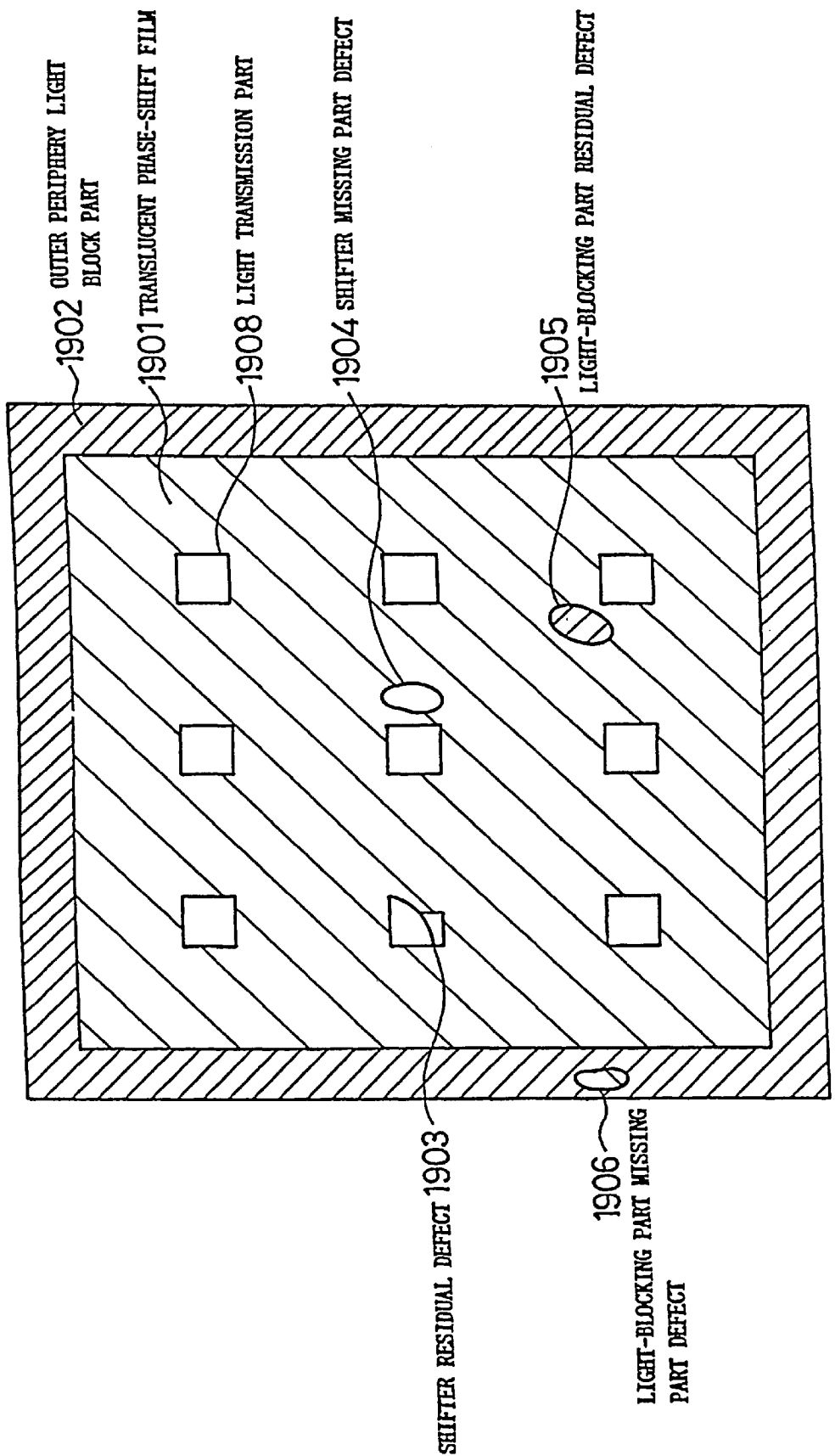
FIG. 19 is a top plan view which shows the configuration of a halftone phase-shift mask that is disclosed in the Japanese Unexamined Patent Publication No. 6-282063.
Figure 20:
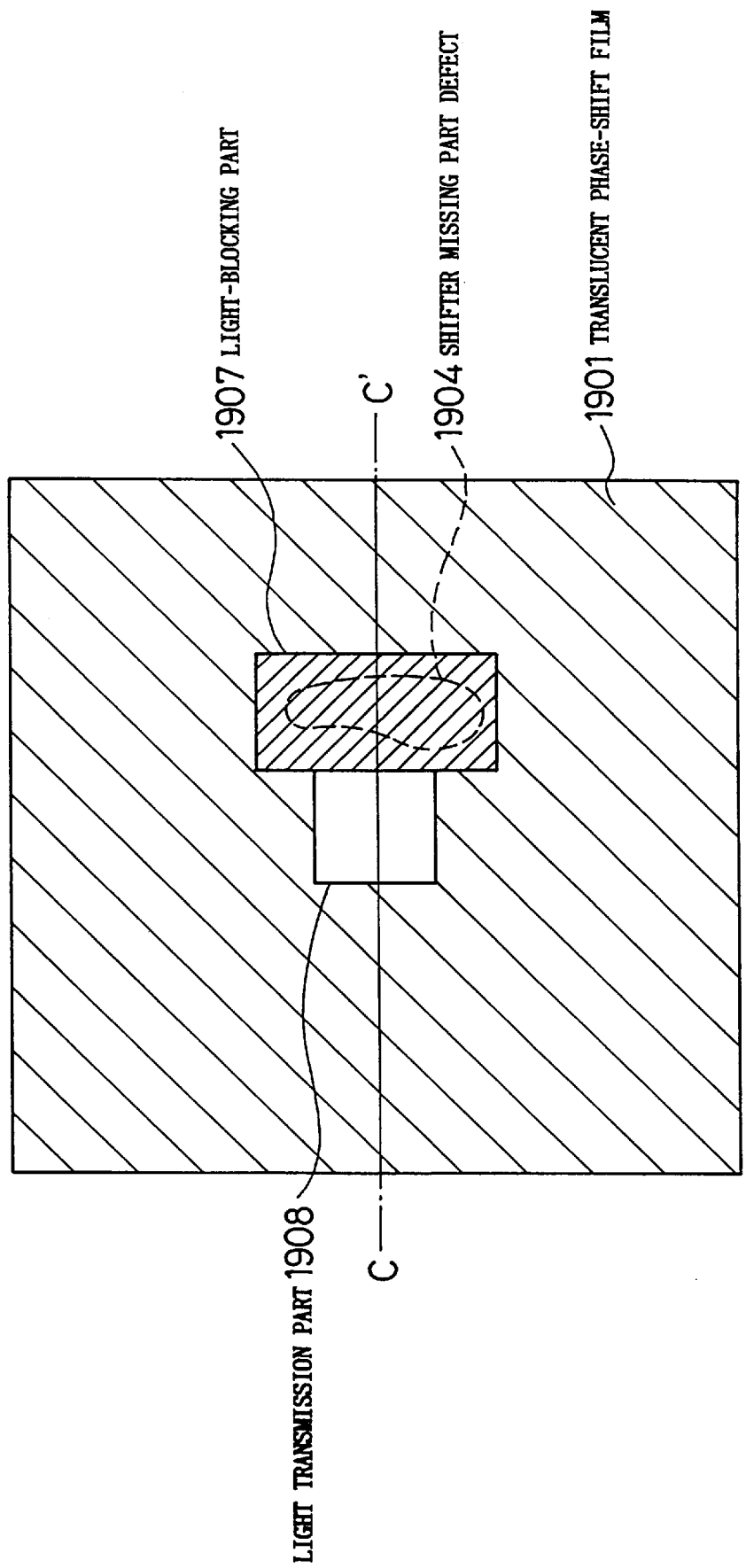
FIG. 20 is a plan view of a halftone phase-shift mask which is shown in FIG. 19 after correction of a shifter missing part defect.

FIG. 15 is a process diagram which illustrates a method of correcting a defect in the thirteenth embodiment of a halftone phase-shift mask according to the present invention.

In this embodiment, FIB gas assisted deposition is first used to cover the light-blocking part residual defect 1305 with the light-blocking part 1307, as shown in FIG. 15 (b).

Then, FIB gas assisted etching is used to form inside the light-blocking part 1307 a phase-inverting light transmission part 1315 that inverts the transmitted light with respect to light that passes through the light transmission part 1308, as shown in FIG. 15 (*c*).

In this embodiment, because it is easy to calculate the surface area of the light-blocking part 1307, it is possible to accurately establish the surface area of the phase-inverting light transmission part 1315.

FIG. 16 is a process diagram which illustrates a method of correcting a defect in the fourteenth embodiment of a halftone phase-shift mask according to the present invention.

In this embodiment, the laser blowing method or the like is first used to remove the light-blocking part residual defect 1405, thereby forming an expanded light transmission part 1419 beforehand, as shown in FIG. 16 (*b*).

Next, using FIB gas assisted deposition, the expanded light transmission part 1419 is buried by the light-blocking part 1407, as shown in FIG. 16 (*c*).

Then, using FIB gas assisted etching, a phase-inverting light transmission part 1415 is formed within the light-blocking part 1407 that inverts the phase of the transmitted light with respect to the light passing through the light transmission part 1408, as shown in FIG. 16 (*d*).

In this embodiment, because it is not necessary in the FIB gas assisted etching process step to etch the light-blocking film of the light-blocking part residual defect 1405 or the translucent phase-shift film 1401, it is possible to improve the uniformity of etching in the process step of exposing the transparent substrate 1407 using chlorine based gas.

FIG. 17 is a process diagram which illustrates a method of correcting a defect in the fifteenth embodiment of a halftone phase-shift mask according to the present invention.

In this embodiment, the laser blowing method or the like is first used to remove the light-blocking part residual defect 1505, thereby forming an expanded light transmission part 1519 beforehand, as shown in FIG. 17 (*b*).

Then, FIB gas assisted etching is used to dig into the expanded light transmission part 1519, thereby forming within the expanded light transmission part 1519 a phase-inverting light transmission part 1515 that inverts the phase of transmitted light with respect to light that passes through the light transmission part 1508, as shown in FIG. 17 (*c*).

In the above-described eighth to fifteenth embodiments, etching is done by any one method such as blowing with a laser, direct etching by means of a focused ion beam, or gas assisted etching using a fluorine based gas or chlorine based gas, and deposition is done by any one method such as direct deposition by means of a focused ion beam, or by using gas assisted focused beam deposition using a hydrocarbon-based gas or metallic carbonyl gas.

The present invention, by virtue of the above-described constitution, brings about the followed described effects.

In the present invention as described above in the form of the first, second, and thirteenth embodiments, because a phase-inverting light transmission part is provided within the light-blocking part that inverts the phase of light that passes therethrough with respect to the phase of light which passes through the light transmission part, and because the mutual ratio of surface areas between the phase-inverting light transmission part and the light-blocking part is established so that the transfer characteristics in the light-blocking part during exposure are the same as those in the translucent phase-inverting part, it is possible to correct a shifter missing part defect that is included within a halftone phase-shift mask without sacrificing the photoresist pattern transfer characteristics.

In the present invention as described above in the form of the third, fourth, and fifteenth embodiments, because a phase-inverting light transmission part is provided within the shifter missing part defect that inverts the phase of light that passes therethrough with respect to the phase of light that passes through the light transmission part, and because the mutual ratio of surface areas between the phase-inverting light transmission part and the shifter missing part defect is established so that the transfer characteristics in the shifter missing part defect during exposure are substantially the same as those in the translucent phase-inverting part, it is possible to have the same kind of effect as is brought about in the present invention as recited in claim 1.

In the present invention as described above in the form of the fifth, sixth, and sixteenth embodiments, because an expanded light transmission part is provided that has a phase-inverting light transmission part that covers the shifter missing part defect, and that inverts the phase of light that passes therethrough with respect to the phase of light that passes through the light transmission part, and because the mutual ratio of surface areas between the expanded light transmission part and the phase-inverting light transmission part is established so that the transfer characteristics in the expanded light transmission part during exposure are substantially the same as those in the translucent phase-inverting part, and it easy to calculate the surface area, even in the case in which the shape of the shifter missing part defect is complex.

In the present invention as described above in the form of the seventh, eight, and seventeenth embodiments, because a phase-inverting light transmission part is formed within the light-blocking part residual defect that inverts the phase of light that passes therethrough with respect to the phase of light that passes through the light transmission part, and because the mutual ratio of surface areas between the phase-inverting light transmission part and the light-blocking part residual defect is established so that the transfer characteristics in the light-blocking part residual defect during exposure are substantially the same as those in the translucent phase-inverting part, it is possible to correct a light-blocking part residual defect that is included within a halftone phase-shift mask without sacrificing the photoresist pattern transfer characteristics.

In the present invention as described above in the form of the ninth, tenth, and eighteenth embodiments, because an expanded light-blocking part is provided that has a phase-inverting light transmission part that covers the light-blocking part residual defect, and that inverts the phase of light that passes therethrough with respect to the phase of light that passes through the light transmission part, and because the mutual ratio of surface areas between the expanded light-blocking part and the phase-inverting light transmission part is established so that the transfer characteristics in the expanded light-blocking part during exposure are substantially the same as those in the translucent phase-inverting part, and it is easy to calculate the surface area, even in the case in which the shape of the light-blocking part residual defect is complex.

In the present invention as described above in the form of the eleventh, twelfth, and nineteenth embodiments, because an expanded light transmission part is provided that has a phase-inverting light transmission part that covers the light-blocking part residual defect and that inverts the phase of light that passes therethrough with respect to the phase of light that passes through the light transmission part, and because the mutual ratio of surface areas between the expanded light transmission part and the phase-inverting light transmission part is established so that the transfer characteristics in the expanded light transmission part during exposure are substantially the same as those in the translucent phase-inverting part, it is possible to have the same kind of effect as i-s brought about in the present invention as recited above.

In the case of using a halftone phase-shift mask in which a defect has been corrected, there is an improvement in the resolution and depth of focus over the entire area of the pattern. For this reason, it is possible to form a finer pattern and to fabricate a semiconductor integrated circuit with a higher level of integration.

What is claimed is:

1. A halftone phase-shift mask comprising:
   a light transmission part which passes light radiated onto a substrate;
   a translucent phase-shift part that inverts a phase of the light and attenuates the amplitude of the light, said translucent phase-shift part having a shifter missing part defect at which there is partial loss of said translucent phase-shift part; and
   a light-blocking part provided so as to cover said shifter missing part defect and which does not allow said light to pass therethrough;
   wherein a phase-inverting light transmission part is provided in said light-blocking part, said phase-inverting light transmission part inverting a phase of the light which passes through said phase-inverting light transmission part with respect to a phase of the light which passes through said light transmission part, and
   wherein the surface area ratio between said phase-inverting light transmission part and said light-blocking part is established so that the light transfer characteristics of said light-blocking part including said phase-inverting light transmission part are substantially the same as the light transfer characteristics of said translucent phase-shift part.

2. A halftone phase-shift mask according to claim 1, wherein, if the surface area of said light-blocking part is S, the surface area of said phase-inverting light transmission part is s, the amplitude transmissivity of said translucent phase-shift film is t, and the amplitude transmissivity of said phase-inverting light transmission part is t', the value of the surface areas of said phase-inverting light transmission part and said light-blocking part is each established so that the relationship s/S=t/t' is satisfied.

3. A halftone phase-shift mask comprising:
   a light transmission part which passes light radiated onto a substrate; and
   a translucent phase-shift part that inverts a phase of the light and attenuates the amplitude of the light, said translucent phase-shift part having a shifter missing part defect at which there is partial loss of said translucent phase-shift part,
   wherein a phase-inverting light transmission part provided in said shifter missing part defect inverts a phase of the light which passes through said phase-inverting light transmission part with respect to a phase of the light which passes through said light transmission part; and
   wherein the surface area ratio between said phase-inverting light transmission part and said shifter missing part defect is substantially equal to a value of a ratio including the light transfer characteristics of said translucent phase-shift part as one operand and the light transfer characteristics of said phase-inverting light transmission part as another operand.

4. A halftone phase-shift mask according to claim 3, wherein, if the surface area of said shifter missing part defect is S2, the surface area of said phase-inverting light transmission part is s, the amplitude transmissivity of said translucent phase-shift film is t, and the amplitude transmissivity of said phase-inverting light transmission part is t', the value of the surface area of said phase-inverting light transmission part is established so that the relationship s/S2=(1-t)/(1-t') is satisfied.

5. A halftone phase-shift mask comprising:
   a light transmission part which passes light radiated onto a substrate;
   a translucent phase-shift part that inverts a phase of the light and attenuates the amplitude of the light, said translucent phase-shift part having a shifter missing part defect at which there is partial loss of said translucent phase-shift part;
   wherein an expanded light transmission part is formed so as to cover said shifter missing part defect, said expanded light transmission part further comprising a phase-inverting light transmission part that inverts a phase of the light which passes through said phase-inverting light transmission part with respect to a phase of the light which passes through said light transmission part, and
   wherein the surface area ratio between said expanded light transmission part and said phase-inverting light transmission part is established so that the light transfer characteristics of said expanded light transmission part including said phase-inverting light transmission part are substantially the same as the light transfer characteristics of said translucent phase-shift part.

6. A halftone phase-shift mask according to claim 5, wherein if the surface area of said expanded light transmission part is S3, the surface area of said phase-inverting light transmission part is s, the amplitude transmissivity of said translucent phase-shift film is t, and the amplitude transmissivity of said phase-inverting light transmission part is t', the value of the surface areas of said expanded light transmission part and said phase-inverting light transmission part is established so that the relationship s/S3=(1-t)/(1-t') is satisfied.

7. The halftone phase-shift mask as claimed in claim 5, wherein said surface area ratio between said expanded light transmission part and said phase-inverting light transmission part is established so that the light transfer characteristics of said expanded light transmission part is substantially equal to a value of a ratio including the light transfer characteristics of said translucent phase-shift part as one operand and the light transfer characteristics of said phase-inverting light transmission part as another operand.

8. A halftone phase-shift mask comprising:
   a light transmission part which passes light radiated onto a substrate;
   a light-blocking part which does not pass the light; and
   a translucent phase-shift part that inverts the phase of the light and attenuates the amplitude of the light, said translucent phase-shift part having a light-blocking residual defect where said light-blocking part remains,
   wherein said light-blocking residual defect further comprises a phase-inverting light transmission part provided in said light-blocking residual defect, said phase-inverting light transmission part inverting a phase of the light which passes through said phase-inverting light transmission part with respect to a phase of the light which passes through said light transmission part; and
   wherein the surface area ratio between said phase-inverting light transmission part and said light-blocking part residual defect is substantially equal to a value of a ratio between the light transfer characteristics of said translucent phase-shift part and said phase-inverting light transmission part.

9. A halftone phase-shift mask according to claim 8, wherein if the surface area of said light-blocking part residual defect expanded light transmission part is S4, the surface area of said phase-inverting light transmission part is s, the amplitude transmissivity of said translucent phase-shift film is t, and the amplitude transmissivity of said phase-inverting light transmission part is t', the value of the surface area of said phase-inverting light transmission part is established so that the relationship s/S4=t/t' is satisfied.

10. A halftone phase-shift mask comprising:
    a light transmission part which passes light radiated onto a substrate;
    a light-blocking part which does not pass the light;
    a translucent phase-shift part that inverts a phase of the light and attenuates the amplitude of the light, said translucent phase-shift part having a light-blocking part residual defect where said light-blocking part remains; and
    an expanded light-blocking part covering said light-blocking part residual defect, wherein said expanded light-blocking part includes a phase-inverting light transmission part that inverts a phase of the light which passes through said phase-inverting light transmission part with respect to a phase of the light which passes through said light transmission part,
    wherein the surface area ratio of said expanded light-blocking part and said phase-inverting light transmission part is established so that the light transfer characteristics of said expanded light-blocking part are substantially the same as those in said translucent phase-shift part.

11. A halftone phase-shift mask according to claim 10, wherein if the surface area of expanded light-blocking part is S5, the surface area of said phase-inverting light transmission part is s, the amplitude transmissivity of said translucent phase-shift film is t, and the amplitude transmissivity of said phase-inverting light transmission part is t', the values of the surface area of said expanded light-blocking part and said phase-inverting light transmission part are established so that the relationship s/S5=t/t' is satisfied.

12. A halftone phase-shift mask comprising:
    a light transmission part which passes light radiated onto a substrate;
    a light-blocking part which does not pass the light;
    a translucent phase-shift part that inverts a phase of the light and attenuates the amplitude of the light, said translucent phase-shift part having a light-blocking part residual defect where said light-blocking part remains; and
    an expanded light transmission part covering said light-blocking part residual defect, wherein said expanded light transmission part includes a phase-inverting light transmission part that inverts a phase of the light which passes through said phase-inverting light transmission part with respect to a phase of the light which passes through said light transmission part,
    wherein the surface area ratio of said expanded light transmission part and said phase-inverting light transmission part is established so that the light transfer characteristics of said expanded light transmission part are substantially the same as those in said translucent phase-shift part.

13. A halftone phase-shift mask according to claim 12, wherein if the surface area of said expanded light transmission part is S6, the surface area of said phase-inverting light transmission part is s, the amplitude transmissivity of said translucent phase-shift film is t, and the amplitude transmissivity of said phase-inverting light transmission part is t', the values of the surface areas of said expanded light transmission part and said phase-inverting light transmission part are established so that the relationship s/S6=(1-t)/(1-t') is satisfied.

14. A method of correcting a defect in a halftone phase-shift mask including a light transmission part which passes light radiated onto a substrate and a translucent phase-shift part that inverts a phase of the light and attenuates the amplitude of the light, said translucent phase-shift part having a shifter missing part defect where there is partial loss of said translucent phase-shift part, comprising:
    depositing a light-blocking part made of a material that does not pass the light so as to cover said shifter missing part defect;
    etching a region within said light-blocking part extending from a top of said light-blocking part into said substrate covered by at least a portion of said light-blocking part, so as to form a phase-inverting light transmission part that causes a phase of the light which passes through said region to be inverted with respect to a phase of the light which passes through said light transmission part; and
    establishing a surface area ratio between said phase-inverting light transmission part and said light-blocking part at a value so that the light transfer characteristics of said light-blocking part are substantially the same as those of said translucent phase-shift part.

15. A method of correcting a defect in a halftone phase-shift mask including a light transmission part which passes light radiated onto a substrate and a translucent phase-shift part that inverts a phase of the light and attenuates the amplitude of the light, said translucent phase-shift part having a shifter missing part defect where there is partial loss of said translucent phase-shift part comprising:
    etching an expanded light transmission part out of said shifter missing part defect;
    depositing a light-blocking part made of a material that does not pass the light so as to cover said expanded light transmission part;
    etching a region within said light-blocking part extending from a top of said light-blocking part into said substrate covered by at least a portion of said light-blocking part, to form a phase-inverting light transmission part that inverts a phase of the light which passes through said region with respect to a phase of the light which passes through said light transmission part; and
    establishing a surface area ratio between said expanded light transmission part and said phase-inverting light transmission part at a value so that the light transfer characteristics of said expanded light transmission part are substantially the same as those of said translucent phase-shift part.

16. A method of correcting a defect in a halftone phase-shift mask including a light transmission part which passes light radiated onto a substrate and a translucent phase-shift part that inverts a phase of the light and attenuates the amplitude of the light, said translucent phase-shift part having a shifter missing part defect where there is partial loss of said translucent phase-shift part comprising:
    etching a region of said substrate adjacent to said shifter missing part defect to form a phase-inverting light transmission part that inverts a phase of the light passing through said region with respect to a phase of the light which passes through said light transmission part; and establishing a surface area ratio between said phase-inverting light transmission part and said shifter missing part defect which is substantially equal to a value of a ratio including the light transfer characteristics of said translucent phase-shift part as one operand and the light transfer characteristics of said phase-inverting light transmission part as another operand.

17. A method of correcting a defect in a halftone phase-shift mask including a light transmission part which passes light radiated onto a substrate and a translucent phase-shift part that inverts a phase of the light and attenuates the amplitude of the light, this translucent phase-shift part having a shifter missing part defect where there is partial loss of said translucent phase-shift part comprising:

etching an expanded light transmission part out of said shifter missing part defect;

etching a region of said substrate within said expanded light transmission part to form a phase-inverting light transmission part that inverts a phase of the light passing through said region with respect to a phase of the light which passes through said light transmission part; and establishing a surface area ratio between said expanded light transmission part and phase-inverting light transmission part so that the light transfer characteristics of said expanded light transmission part are substantially the same as those of said translucent phase-shift part.

18. A method of correcting a defect in a halftone phase-shift mask including a light transmission part which passes light radiated onto a substrate, a translucent phase-shift part that inverts a phase of the light and attenuates the amplitude of the light, and a light-blocking part that does not pass the light, wherein said translucent phase-shift part has a light-blocking part residual defect at which a part thereof remains, said method comprising:

etching a region within said light-blocking residual defect to expose a corresponding region of said substrate;

etching said corresponding region of said substrate to form a phase-inverting light transmission part that inverts a phase of the light which passes through this phase-inverting light transmission part to be inverted with respect to a phase of the light which passes through said light transmission part; and establishing a surface area ratio between said phase-inverting light transmission part and said light-blocking part residual defect is substantially equal to a value of a ratio including the light transfer characteristics of said translucent phase-shift part as one operand and the light transfer characteristics of said phase-inverting light transmission part as another operand.

19. A method of correcting a defect in a halftone phase-shift mask including a light transmission part which passes light radiated onto a substrate, a translucent phase-shift part covering a portion of said substrate and including a light-blocking residual defect, and a light-blocking part, wherein said method comprises:

depositing an expanded light-blocking part so as to cover said light-blocking part residual defect;

etching a region within said expanded light-blocking part to expose said substrate and etching a portion of said substrate so as to form a phase-inverting light transmission part that causes a phase of the light which passes through this region to be inverted with respect to a phase of the light which passes through said light transmission part, and a step of establishing the surface area ratio between said expanded light-blocking part and said phase-inverting light transmission part at a value so that the transfer characteristics of said expanded light-blocking part during exposure are substantially the same as those of said translucent phase-shift part.

20. A method of correcting a defect in a halftone phase-shift mask including a light transmission part which passes light radiated onto a substrate, a translucent phase-shift part that inverts a phase of the light and attenuates the amplitude of the light, and a light-blocking part that does not pass the light, said translucent phase-shift part having a light-blocking part residual defect where part of said light-blocking part remains, said method comprising:

etching an expanded light transmission part out of said light-blocking part residual defect;

depositing expanded light-blocking part, comprising a material that does not pass the light, over said expanded light transmission part;

etching a region of said substrate within said expanded light-blocking part to form a phase-inverting light transmission part that inverts a phase of the light which passes through said region with respect to a phase of the light which passes through said light transmission part, and establishing a surface area ratio between said expanded light-blocking part and said phase-inverting light transmission part so that the light transfer characteristics of said expanded light-blocking part are substantially the same as those of said translucent phase-shift part.

21. A method of correcting a defect in a halftone phase-shift mask including a light transmission part which passes light radiated onto a substrate, a translucent phase-shift part that inverts a phase of the light and attenuates the amplitude of the light, and a light-blocking part that does not pass the light, said translucent phase-shift part having a light-blocking part residual defect where part of said light-blocking part remains, this method comprising:

etching an expanded light transmission part out of said light-blocking part residual defect;

etching a region within said light-blocking part extending from a top of said light-blocking part into a portion of said substrate covered by at least a portion of said light-blocking part to form a phase-inverting light transmission part that inverts a phase of the light which passes through said region with respect to a phase of the light which passes through said light transmission part, and establishing a surface area ratio between said expanded light transmission part and said phase-inverting light transmission part so that the light transfer characteristics of said expanded light transmission part are substantially the same as those of said translucsnt phase-shift part.

22. A method of correcting a defect in a halftone phase-shift mask according to claim 14, wherein said etching is performed by any one method selected from a group consisting of direct etching by blowing by a laser or by means of focused ion beam milling, and gas assisted focused beam etching which uses a fluorine based gas or a chlorine based gas.

23. A method of correcting a defect in a halftone phase-shift mask according to claim 14, wherein said deposition is performed by one method selected from the group of direct deposition by using a focused ion beam, and gas assisted focused beam deposition using either hydrocarbon based gas or metallic carbonyl gas.

* * * * *